(12) United States Patent
Lee

(10) Patent No.: US 8,569,836 B2
(45) Date of Patent: Oct. 29, 2013

(54) SEMICONDUCTOR DEVICE

(75) Inventor: Mueng-Ryul Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 85 days.

(21) Appl. No.: 13/307,218

(22) Filed: Nov. 30, 2011

(65) Prior Publication Data

US 2012/0175673 A1    Jul. 12, 2012

(30) Foreign Application Priority Data

Jan. 12, 2011   (KR) .................. 10-2011-0003178

(51) Int. Cl.
*H01L 23/62*   (2006.01)

(52) U.S. Cl.
USPC ........... 257/355; 257/337; 257/362; 257/439; 257/E29.005; 361/56; 361/58; 361/100

(58) Field of Classification Search
USPC ............ 257/140–141, 336–339, 355–357, 257/438–439; 361/56–56, 100
See application file for complete search history.

(56) References Cited

U.S. PATENT DOCUMENTS

| 7,420,255 | B2 | 9/2008 | Shimizu | |
|---|---|---|---|---|
| 2004/0075145 | A1* | 4/2004 | Shibib | 257/355 |
| 2008/0024946 | A1 | 1/2008 | Sato | |
| 2008/0246345 | A1* | 10/2008 | Zecri et al. | 307/413 |
| 2010/0032758 | A1* | 2/2010 | Wang et al. | 257/343 |
| 2013/0107403 | A1* | 5/2013 | de Boet | 361/56 |

FOREIGN PATENT DOCUMENTS

JP   2009-158701 A   7/2009

* cited by examiner

*Primary Examiner* — Dung A. Le
(74) *Attorney, Agent, or Firm* — Lee & Morse, P.C.

(57) ABSTRACT

A semiconductor device includes an output port that has a first lateral double diffused metal oxide semiconductor (LDMOS) device and an electrostatic discharge protection device that has a second LDMOS device and a bipolar transistor and that protects the output port from electrostatic discharge. A breakdown voltage of the second LDMOS device is equal to or lower than a breakdown voltage of the first LDMOS device.

15 Claims, 13 Drawing Sheets

SEMICONDUCTOR DEVICE

CROSS-REFERENCE TO RELATED APPLICATION

Korean Patent Application No. 10-2011-0003178, filed on Jan. 12, 2011, in the Korean Intellectual Property Office, and entitled: "Semiconductor Device and Fabricating Method Thereof," is incorporated by reference herein in its entirety.

BACKGROUND

Semiconductor integrated circuit (IC) devices may be manufactured by using various types of technology. For example, semiconductor IC devices may be manufacturing using complementary metal-oxide semiconductor (CMOS) technology.

SUMMARY

Embodiments may be realized by providing a semiconductor device having an output port including a first lateral double diffused metal oxide semiconductor (LDMOS) device, and an electrostatic discharge protection device that includes a second LDMOS device and a bipolar transistor and that protects the output port from electrostatic discharge. A breakdown voltage of the second LDMOS device is equal to or lower than a breakdown voltage of the first LDMOS device.

The first LDMOS device may include a first gate on a substrate, a first source region at one side of the first gate, the first source region having a first conductivity type, and a first body region under the first source region and surrounding the first source region, the first body region having a second conductivity type, the second conductivity type being different from the first conductivity type. The first LDMOS device may also include a first body contact region in the first body region, the first body contact region having the second conductivity type, a first drain region at another side of the first gate, the first drain region having the first conductivity type, a first isolation region in the substrate between the first source region and the first drain region, the first isolation region overlapping a portion of the first gate, a first deep well under the first body region, the first deep well having the second conductivity type, and a first buried layer under the first deep well, the first buried layer having the first conductivity type.

The second LDMOS device may include a second gate on the substrate, a second body region at one side of the second gate, the second body region having the second conductivity type, a second body contact region in the second body region, the second body contact region having the second conductivity type, a second drain region at another side of the second gate, the second drain region having the first conductivity type, a second isolation region in the substrate between the second body region and the second drain region, the second isolation region overlapping a portion of the second gate, a second deep well under the second body region, the second deep well having the second conductivity type, and a second buried layer under the second deep well, the second buried layer having the first conductivity type. The second LDMOS device may include a second source region in the second body region, the second source region having the first conductivity type.

The bipolar transistor may include an emitter region spaced apart from the second body region, the emitter region having the first conductivity type, a base region under the emitter region and surrounding the emitter region, the base region having the second conductivity type, and the second drain region. The bipolar transistor may include an epitaxial layer under the base region. The base region may be in a non-overlapping relationship with the second deep well. A doping concentration of the base region may be higher than a doping concentration of the second deep well and lower than a doping concentration of the second body region.

A first distance from a bottom surface of the substrate to a bottom surface of the base region may be greater than a second distance from the bottom surface of the substrate to a bottom surface of the second body region. A length of the second isolation region may be equal to or smaller than a length of the first isolation region. A second overlapping length between the second isolation region and the second deep well may be equal to or greater than a first overlapping length between the first isolation region and the first deep well.

The first LDMOS device may include a first drift region that is under the first isolation region and the first drain region and that surrounds the first isolation region and the first drain region, the first drift region having the first conductivity type. The second LDMOS device may include a second drift region that is under the second isolation region and the second drain region and that surrounds the second isolation region and the second drain region, the second drift region having the first conductivity type. a length of the second isolation region is equal to or smaller than a length of the first isolation region.

A portion of the base region and a portion of the second deep well may overlap each other. Substantially an entire area of the base region may be in a non-overlapping relationship with the second deep well. The bipolar transistor may include an emitter region in the second body region, the emitter region having the first conductivity type, the second body region surrounding the emitter region, and the second drain region.

Embodiments may also be realized by providing an output port including a first lateral double diffused metal oxide semiconductor (LDMOS) device, and an electrostatic discharge protection device that includes a second LDMOS device and a silicon controlled rectifier and that protects the output port from electrostatic discharge. A breakdown voltage of the second LDMOS device is equal to or lower than a breakdown voltage of the first LDMOS device.

The silicon controlled rectifier may include a NPN bipolar transistor and a PNP bipolar transistor. The first LDMOS device may include a first gate on a substrate, a first source region at one side of the first gate, the first source region having a first conductivity type, and a first body region under the first source region and surrounding the first source region, the first body region having a second conductivity type, the second conductivity type being different from the first conductivity type. The first LDMOS device may also include a first body contact region in the first body region, the first body contact region having the second conductivity type, a first drain region at another side of the first gate, the first drain region having the first conductivity type, a first isolation region in the substrate between the first source region and the first drain region, the first isolation region overlapping a portion of the first gate, a first deep well under the first body region, the first deep well having the second conductivity type, and a first buried layer under the first deep well, the first buried layer having the first conductivity type.

The second LDMOS device may include a second gate on the substrate, a second body region at one side of the second gate, the second body region having the second conductivity type, a second body contact region in the second body region, the second body contact region having the second conductivity type, a second drain region at another side of the second gate, the second drain region having the first conductivity type, a second isolation region in the substrate between the second body region and the second drain region, the second isolation region overlapping a portion of the second gate, a second deep well under the second body region, the second deep well having the second conductivity type, and a second buried layer under the second deep well, the second buried layer having the first conductivity type.

A length of the second isolation region may be equal to or smaller than a length of the first isolation region. A second overlapping length between the second isolation region and the second deep well is equal to or greater than a first overlapping length between the first isolation region and the first deep well.

The NPN bipolar transistor may include an emitter region having the first conductivity type and a base region having the second conductivity type. The emitter region having the first conductivity type may be spaced apart from the second body region. The base region may be being under the emitter region of the first conductivity type and may surround the emitter region of the first conductivity type and the second drain region. The PNP bipolar transistor may include an emitter region having the second conductivity type and an epitaxial layer having the first conductivity type. The emitter region having the second conductivity type may be between the second drain region and the second isolation region, and the epitaxial layer may be on the second buried layer and the second body contact region.

The electrostatic discharge protection device may include an impurity region having the first conductivity type, the impurity region being between the second isolation region and the emitter region having the second conductivity type. The semiconductor device may include a poly resistor connected to the second body contact region.

The NPN bipolar transistor may include the second drain region, a base region that has the second conductivity type and that is at one side of the second body region, and an emitter region having the first conductivity type. The emitter region having the first conductivity type may be on the base region and the second body region while extending over the base region and the second body region. The PNP bipolar transistor may include an emitter region having the second conductivity type and an epitaxial layer having the first conductivity type. The emitter region having the second conductivity type may be between the second drain region and the second isolation region, and the epitaxial layer having the first conductivity type may be on the second buried layer and the second body contact region. The semiconductor device may include a third isolation region between the second drain region and the emitter region having the second conductivity type.

Embodiments may also be realized by providing a semiconductor device including a substrate having a first region and a second region defined therein, the first region having a first LDMOS device of an output port formed therein, the second region having an electrostatic discharge protection device formed therein, and the electrostatic discharge protection device including a second LDMOS device and a bipolar transistor. The embodiment also includes a method of forming the semiconductor device that includes forming a first buried layer in the first region and a second buried layer in the second region by implanting impurity of a first conductivity type into the substrate, forming a first deep well in the first region and a second deep well in the second region by implanting impurity of a second conductivity type into the substrate, forming a first isolation region in the first region and a second isolation region in the second region, forming a first gate on the substrate in the first region and a second gate on the substrate in the second region, forming a first body region in the first region and a second body region in the second region by implanting impurity of the second conductivity type into the substrate, and implanting impurities of the first and the second conductivity types into the substrate to form a first body contact region of the second conductivity type in the first body region and a second body contact region of the second conductivity type in the second body region, first source and drain regions of the first conductivity type in the first region, an emitter region of the first conductivity type in the second region, and a second drain region of the first conductivity type in the second region.

The second isolation region may be formed to have a length that is equal to or smaller than a length of the first isolation region. The second isolation region may be formed to have a second overlapping length between the second isolation region and the second deep well that is equal to or greater than a first overlapping length between the first isolation region and the first deep well.

After the forming of the first and second isolation regions and before the forming of the first and second gates, the method may include forming a base region in the second region by implanting impurity of the second conductivity type into the substrate. A portion of the base region may be formed to overlap with the second deep well such that other portions of the base region are in a non-overlapping relationship with the second deep well. A doping concentration of the base region may be higher than a doping concentration of the second deep well and lower than a doping concentration of the second body region.

A first distance from a bottom surface of the substrate to a bottom surface of the base region may be greater than a second distance from the bottom surface of the substrate to a bottom surface of the second body region. After the forming of the first and second deep wells and before the forming of the first and second isolation regions, the method may include forming a first drift region in the first region and a second drift region in the second region by a second process of implanting impurity of the first conductivity type into the substrate.

After the forming of the first and second buried layers and before the forming of the first and second deep wells, the method may include forming an epitaxial layer having the first conductivity type on the first and second buried layers. The method may include forming an emitter region having the second conductivity type in the second region during the forming of the second body contact region having the second conductivity type in the second body region by implanting impurity of the second conductivity type into the substrate. The method may include forming a third isolation region in the second region during the forming of the first and second isolation regions.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
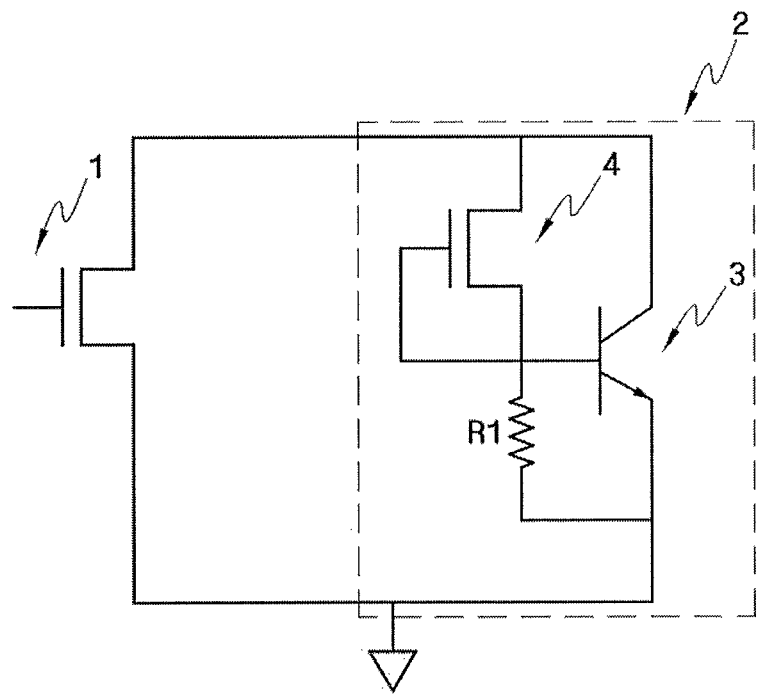
FIG. 1 illustrates an equivalent circuit view of a semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. Further, the thickness of layers and regions may be exaggerated for clarity. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the embodiments.

Hereinafter, a semiconductor device according to an exemplary embodiment of will be described with reference to FIGS. 1 to 3. FIG. 1 illustrates an equivalent circuit view of a semiconductor device according to an exemplary embodiment, FIG. 2 illustrates a cross-sectional view of the semiconductor device shown in FIG. 1, and FIG. 3 illustrates the equivalent circuit view shown in FIG. 1 incorporated into the cross-sectional view of FIG. 2.

Figure 2:
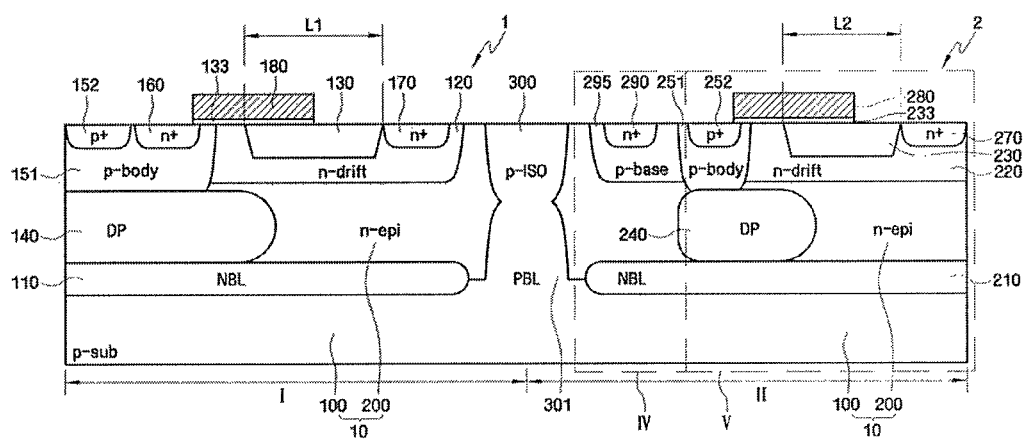
FIG. 2 illustrates a cross-sectional view of the semiconductor device shown in FIG. 1.
Figure 3:
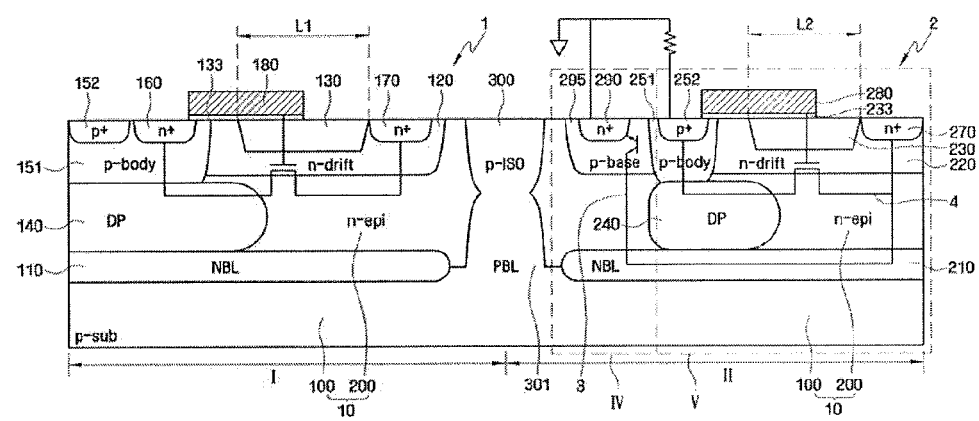
FIG. 3 illustrates the equivalent circuit view shown in FIG. 1 incorporated into the cross-sectional view of FIG. 2.

Referring to FIGS. 1 and 2, a semiconductor device may include an output port, e.g., the output port may include a first lateral double diffused metal oxide semiconductor (LDMOS) device 1. The semiconductor device may include an electrostatic discharge (ESD) protection device 2 that may protect the output port from electrostatic discharge. The ESD protection device 2 may include, e.g., a bipolar transistor 3 and a second LDMOS device 4. Throughout the specification, the phrase LDMOS device means a device including a gate, a drain region of a first conductivity type, a body region of a second conductivity type, and an isolation region formed between the drain region of the first conductivity type and the body region of the second conductivity type.

For convenience of explanation, FIGS. 1 and 2 illustrate the first LDMOS device 1 as including an N-type LDMOS transistor, the bipolar transistor 3 as being an NPN bipolar transistor, and the second LDMOS device 2 as including an N-type drain region. However, embodiments are not limited thereto. For example, as is obvious to one skilled in the art, the first LDMOS device 1 may include a P-type LDMOS transistor, the bipolar transistor 3 may be a PNP bipolar transistor, and the second LDMOS device 2 may include a P-type drain region. The N-type and the P-type may be reversed in an LDMOS device.

Referring to FIG. 2, the substrate 10 may include a first region I where the first LDMOS device 1 of the output port may be formed. The substrate 10 may include a second region II where the ESD protection device 2 may be formed. The second region II may include, e.g., a bipolar transistor region IV and/or a second LDMOS device region V.

The substrate 10 may include a P-type bulk substrate 100 and an N-type epitaxial layer 200 formed on the P-type bulk substrate 100. The P-type bulk substrate 100 may include, e.g., at least one of a silicon semiconductor substrate, a gallium arsenic semiconductor substrate, a silicon germanium semiconductor substrate, a ceramic semiconductor substrate, a quartz semiconductor substrate, a glass semiconductor substrate, and the like. The N-type epitaxial layer 200 may be formed in the first region I and the second region II.

Hereinafter, the first LDMOS device 1 formed in the first region I will be described. A first gate 180 may be formed on portions of, e.g., a first drift region 120 and a first isolation region 130. The first gate 180 may be made of, e.g., polysilicon. However, embodiments are not limited thereto. For example, the first gate 180 may be made of, e.g., a metal, a combination of a metal and polysilicon, or other conductive materials. A first gate insulation layer 133 may be formed under the first gate 180 to electrically isolate the first gate 180 from the substrate 10.

The first isolation region 130 may be disposed to provide a separation between the first gate 180 and an N-type first drain region 170, e.g., so that the first gate 180 may be spaced apart from the N-type first drain region 170 by the first isolation region 130. The first isolation region 130 may be formed using, e.g., a shallow trench isolation (STI) process. However, embodiments are not limited thereto. For example, the first isolation region 130 may be formed using a local oxidation of silicon (LOCOS) process. When, e.g., a high voltage, is applied to the N-type first drain region 170, the possibility of the reliability of the semiconductor device being deteriorated may be reduced and/or prevented. For example, the possibility of the reliability of the semiconductor device being deteriorated due to a high electric field formed between the N-type first drain region 170 and an edge of the first gate 180 may be reduced and/or prevented.

An N-type first source region 160 may be formed at one side of the first gate 180. A silicide layer (not shown) may be formed on the N-type first source region 160 in order to, e.g., reduce resistance between the N-type first source region 160 and a source electrode. The first gate 180 may overlap a portion of the N-type first source region 160. The N-type first drain region 170 may be formed spaced apart from an opposing side of the first gate 180. A silicide layer (not shown) may be formed on the N-type first drain region 170 in order to, e.g., reduce resistance between the N-type first drain region 170 and a drain electrode.

A P-type first body region 151 may be formed at the one side of the first gate 180. For example, the P-type first body region 151 may be formed under the N-type first source region 160. The P-type first body region 151 may be formed to surround the N-type first source region 160. The P-type first body region 151 may have a lower doping concentration than doping concentrations of the N-type first source region 160 and the N-type first drain region 170, e.g., the P-type first body region 151 may be a lightly doped body. The doping concentration may be, e.g., a concentration of impurities doped (or implanted) into each region.

A P-type first body contact region 152 may be formed in the P-type first body region 151. The P-type first body contact region 152 may be near and/or adjacent to the N-type first source region 160. A portion of the P-type first body region 151 may be disposed between the P-type first body contact region 152 and the N-type first source region 160. A depth of the P-type first body contact region 152 may correspond to a depth of the N-type first source region 160, e.g., both the P-type first body contact region 152 and the N-type first source region 160 may be formed to have a predetermined depth in the P-type first body region 151.

The N-type first drift region 120 may be formed in the substrate 10 to extend, e.g., from the P-type first body region 151 to the N-type first drain region 170. The N-type first drift region 120 may be formed to surround the first isolation region 130 and the N-type first drain region 170. The N-type first drift region 120 may be formed on the N-type epitaxial layer 200 and may be spaced apart from a P-type first deep well 140. The N-type first drift region 120 may have the same conductivity type as the N-type epitaxial layer 200. The N-type first drift region 120 may have a lower doping concentration than doping concentrations of the N-type first drain region 170 and the P-type first body region 151. Accordingly, when a reverse bias is applied to the N-type first source region 160 and the N-type first drain region 170, a depletion region may be more easily formed in a region, e.g., at least one of the N-type first drift region 120 and the N-type epitaxial layer 200, between the P-type first body region 151 and the N-type first drain region 170 in a horizontal direction of the substrate 10.

Without intending to be bound by this theory, if the N-type first drift region 120 has a higher doping concentration than the N-type epitaxial layer 200, a voltage higher than a threshold voltage applied to the N-type first source region 160 and the N-type first drain region 170 may allow the current to flow in the N-type first drift region 120 more smoothly than in the N-type epitaxial layer 200. Accordingly, if a voltage higher than a threshold voltage is applied to the N-type first source region 160 and the N-type first drain region 170, the current may flow more easily from the N-type first source region 160 to the first drain region 170 through a current path using the N-type first drift region 120. As such a turn-on resistance of the semiconductor device may be lowered.

Without intending to be bound by this theory, if the N-type epitaxial layer 200 having a sufficiently low doping concentration and the N-type first drift region 120 having a doping concentration slightly higher than that of the N-type epitaxial layer 200 are formed between the P-type first body region 151 and the N-type first drain region 170, a depletion region may be easily formed between the P-type first body region 151 and the N-type first drain region 170 before the semiconductor device is turned on. As such, the threshold voltage may be increased and/or the turn-on resistance may be lowered, e.g., by supplying the current path using the N-type first drift region 120 once the semiconductor device is turned on.

The P-type first deep well 140 may be disposed between the N-type first drift region 120 and the N-type first buried layer 110. The P-type first deep well 140 may be connected to, e.g., may practically contact, the P-type first body region 151, e.g., may be directly under the P-type first body region 151. As such, the P-type first deep well 140 may form a vertical electric field in the semiconductor device using, e.g., a source voltage.

According to an exemplary embodiment, horizontal and vertical electric fields may be formed at a region between the P-type first body region 151 and the N-type first drain region 170, e.g., in the N-type first drift region 120 and the N-type epitaxial layer 200. Thereby a reduced surface filed (RE-SURF) effect may be inducing. The horizontal and vertical electric fields may be formed in intersecting directions. For example, the P-type first deep well 140 may form a depletion region vertically in the region between the P-type first body region 151 and the N-type first drain region 170. In addition, a horizontal depletion region may be optimized, e.g., more effectively formed, between the P-type first body region 151 and the N-type first drain region 170 by the vertically formed depletion region. Accordingly, in a case where the depletion region is fully formed at a region between the P-type first body region 151 and the N-type first drain region 170, the threshold voltage may be less affected by a doping concentration of the region between the P-type first body region 151 and the N-type first drain region 170. Accordingly, the turn-on resistance may be lowered, e.g., effectively lowered, while the breakdown voltage of the semiconductor device may be increased.

As described above, the N-type first buried layer 110 may have a higher doping concentration than the N-type first drift region 120 and N-type epitaxial layer 200, e.g., so as to more easily form the depletion region in the region between the P-type first body region 151 and the N-type first drain region 170 in a vertical direction.

A P-type insulation layer 300 may be formed between the first LDMOS device 1 formed in the first region I and the ESD protection device 2 formed in the second region II. The P-type insulation layer 300 may be formed in both the first region I and the second region II, e.g., adjacent to the first LDMOS device 1 and the ESD protection device 2. A P-type buried layer 301 may be formed between the N-type first buried layer 110 formed in the first region I and a N-type second buried layer 210 formed in the second region II. The P-type buried layer 301 may be under, e.g., directly under, the P-type insulating layer 300.

The ESD protection device 2 formed in the second region II will be described. The ESD protection device 2 may include a bipolar transistor region IV and a second LDMOS device region V. For example, the bipolar transistor region IV may be adjacent to the LDMOS device region V in the second region II. Components of a bipolar transistor 3, e.g., of FIG. 1, may be formed in the bipolar transistor region IV. Components of a second LDMOS device 4, e.g., of FIG. 1, may be formed in the second LDMOS device region V.

Similarly to the first LDMOS device 1, the second LDMOS device region V may include various combinations of a second gate 280, a second gate insulation layer 233, an N-type second drift region 220, a second isolation region 230, an N-type second drain region 270, a P-type second body region 251, a P-type second body contact region 252, an N-type epitaxial layer 200, a P-type second deep well 240, and an N-type second buried layer 210. The second LDMOS device region V may not include, e.g., may exclude, an N-type source region, unlike the first region I. The respective components of the second LDMOS device region V may be substantially the same as and/or similar to those in the first region I. Accordingly, repetitive detailed descriptions of the respective components of the second LDMOS device region V will be omitted.

A bipolar transistor region IV may be formed at one side of the P-type second body region 251 of the second LDMOS device region V. For example, the bipolar transistor region IV may be formed between the P-type second body region 251 of the second LDMOS device region V and a P-type insulation layer 300. The bipolar transistor region IV may include an N-type emitter region 290, a P-type base region 295, and the N-type epitaxial layer 200. The N-type epitaxial layer 200 may be under the P-type base region 295 and the N-type emitter region 290.

The N-type emitter region 290 may be spaced apart from the P-type second body region 251, e.g., by the P-type base region 295. The P-type base region 295 may be formed under the N-type emitter region 290 to surround the same, e.g., a portion of the P-type base region 295 may be under the N-type emitter region 290. The P-type base region 295 and the P-type second body region 251 may contact each other, e.g., lateral sides of the P-type base region 295 and P-type second body region 251 may be in an abutting arrangement.

A doping concentration of the P-type base region 295 may be higher than a doping concentration of the P-type second deep well 240 and lower than a doping concentration of the P-type second body region 251. The P-type base region 295 and the P-type second deep well 240 may be fanned so as not to overlap each other, i.e., to be in a non-overlapping relationship. A depth from a top surface, e.g., of the substrate 10, to a bottom surface of the P-type base region 295 may be smaller than a depth from the top surface, e.g., of the substrate 10, to a bottom surface of the P-type second body region 251. A height from a bottom surface of the substrate 10 to the bottom surface of the P-type base region 295 may be greater than a height from the bottom surface of the substrate 10 to the bottom surface of the P-type second body region 251. According to an exemplary embodiment, the P-type base region 295 may function as a base of the bipolar transistor 3, e.g., of FIG. 1, and the current capability of the ESD protection device 2 may be increased by, e.g., lowering the doping concentration of the P-type base region 295 and reducing a junction depth.

Referring to FIGS. 1 and 3, the N-type first source region 160, the N-type first drain region 170, and the first gate 180 may be a source, a drain, and a gate of the first LDMOS device 1, respectively. The N-type emitter region 290, the P-type base region 295, and the N-type second drain region 270 may be an emitter, a base, and a collector of the bipolar transistor 3, respectively. The N-type second drain region 270 and the second gate 280 may be a drain and a gate of the second LDMOS device 4, respectively.

The drain of the first LDMOS device 1 may be connected to an output pad (not shown). The gate first LDMOS device 1 may be connected to a driving circuit (not shown). The source first LDMOS device 1 may be connected to a ground voltage. The first LDMOS device 1 and the ESD protection device 2 may be connected in parallel with each other between the output pad and the ground voltage. The drain of the second LDMOS device 4 may be connected to a power supply voltage through, e.g., the output pad. The gate of the second LDMOS device 4 may be connected to a body region. Alternatively, the gate of the second LDMOS device 4 may be connected to the ground voltage. The emitter of the bipolar transistor 3 may be connected to the ground voltage.

In FIG. 1, R1 may refer to a resistor of the P-type second body region 251. Alternatively, R1 may refer to an external poly resistor additionally provided to, e.g., lower the turn-on current of the bipolar transistor 3. The external poly resistor may be formed of, e.g., polysilicon for forming the second gate 280 used for the second LDMOS device 4. The external poly resistor may be a resistor provided as, e.g., a passive element.

Referring to FIGS. 1 to 3, a breakdown voltage (BV) of the ESD protection device 2 may be higher than an operating voltage of the semiconductor device. The breakdown voltage (BV) of the ESD protection device 2 may be lower than a breakdown voltage of the first LDMOS device 1 of the output port. For example, the breakdown voltage of the second LDMOS device 4 may be equal to or lower than a breakdown voltage (BV) of the first LDMOS device 1.

The breakdown voltage of the ESD protection device 2 may be generated at the second LDMOS device 4. According to an exemplary embodiment, if both of the first LDMOS device 1 and the second LDMOS device 4 are formed of LDMOS devices, the breakdown voltages thereof may be generated in the same mechanism. Therefore, if the semiconductor device is designed such that the breakdown voltage of the second LDMOS device 4 is lower than that of the first LDMOS device 1, the breakdown voltage of the second LDMOS device 4 may lower than that of the first LDMOS device 1 all the time. Accordingly, the breakdown voltage of the ESD protection device 2 may be kept lower than the breakdown voltage of the first LDMOS device 1 all the time. As such, the possibility of a failure due to, e.g., electrostatic discharge, may be reduced and/or prevented. Further, if the ESD protection device 2 includes the bipolar transistor 3, even if the breakdown voltage of the second LDMOS device 4 is equal to that of the first LDMOS device 1, the breakdown voltage of the ESD protection device 2 may be lower all the time than the breakdown voltage of the first LDMOS device 1. Therefore, even if the breakdown voltage of the second LDMOS device 4 is equal to that of the first LDMOS device 1, the possibility of a failure due to, e.g., electrostatic discharge, may be reduced and/or prevented.

A length L2 of the second isolation region 230 in the second LDMOS device region V may be made to be equal to or smaller than a length L1 of the first isolation region 130 of the first LDMOS device 1, e.g., in order to design the semiconductor device such that the breakdown of the second LDMOS device 4 is made to be equal to or lower than that of the first LDMOS device 1, according to an exemplary embodiment. The lengths L1 and L2 of the first and second isolation regions 130 and 230 refer to lengths in the same directions as directions ranging from the P-type first and second body regions 151 and 251 to the N-type first and second drain regions 170 and 270, respectively. For example, the first isolation region 130 may be arranged such that the first gate 180 is spaced apart by a same distance or a greater distance than the second gate 280 and the N-type second drain region 270 are spaced apart by the second isolation region 230.

Referring to FIGS. 1 to 3, the operation of the semiconductor device in an event of electrostatic discharge being present will be described. If electrostatic discharge is generated, drain voltages of the first and second LDMOS devices 1 and 4 may increase. According to an exemplary embodiment, if the breakdown voltage of the second LDMOS device 4 is equal to or lower than that of the first LDMOS device 1, breakdown may occur to the second LDMOS device 4 rather than to the first LDMOS device 1.

If the breakdown occurs to the second LDMOS device 4, a current derived from impact ionization may flow in the second LDMOS device 4. Accordingly, the current may flow toward a P-type second body contact region 252 of the second LDMOS device 4 and then may flow back to the resistor R1. Therefore, a voltage drop in the resistor R1 may be generated. If the voltage of the resistor R1 is equal to or greater than the turn-on voltage of the bipolar transistor 3, the bipolar transistor 3 may operate so that the current generated due to electrostatic discharge may flow in the bipolar transistor 3. Therefore, the first LDMOS device 1 in the output port may be protected.

According to an exemplary embodiment, if the ESD protection device 2 includes the second LDMOS device 4 having substantially the same and/or similar configuration as that of the first LDMOS device 1 in the output port, when electrostatic discharge is generated, the breakdown may be generated at the first LDMOS device 1 and the ESD protection device 2 in substantially the same mechanism. As the result, even if a process dispersion is created, the breakdown voltage of the ESD protection device 2 may always be lower than that of the first LDMOS device 1. Accordingly, the first LDMOS device 1 may be protected from the electrostatic discharge.

Figure 4:
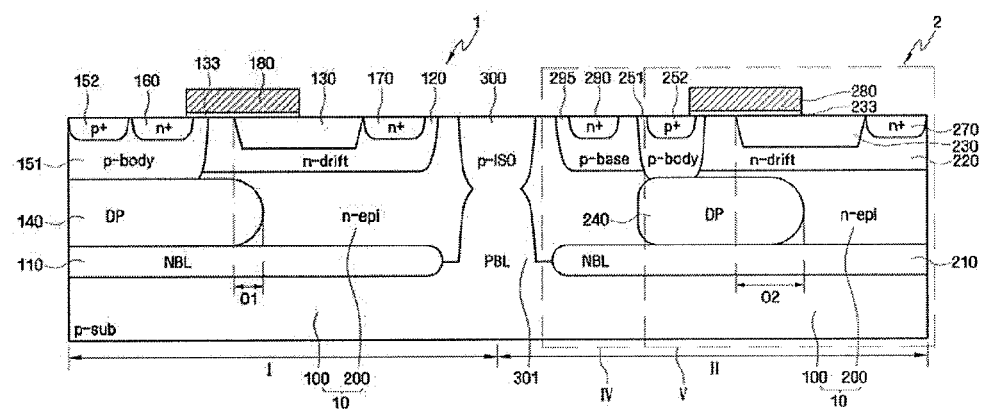
FIGS. 4 to 7 illustrate cross-sectional views of semiconductor devices, according to exemplary embodiments.

A semiconductor device according to another exemplary embodiment will now be described with reference to FIG. 4. FIG. 4 illustrates a cross-sectional view of a semiconductor device according to another exemplary embodiment. An exemplary equivalent circuit of the semiconductor device shown in FIG. 4 may be substantially the same as or similar to that of FIG. 1. In FIG. 4, substantially the same functional components as those of FIGS. 1 to 3 are denoted by the same reference numerals and detailed descriptions thereof will be omitted.

Referring to FIG. 4, the semiconductor device according to an exemplary embodiment includes an alternative exemplary design scheme for making a breakdown voltage of a second LDMOS device 4 equal to or lower than that of a first LDMOS device 1. According to an exemplary embodiment, an overlapping length O2 between the second isolation region 230 and the P-type second deep well 240 may be made to be equal to or greater than an overlapping length O1 between the first isolation region 130 and the P-type first deep well 140. For example, the second isolation region 230 may overlap a greater length of the underlying P-type second deep well 240 in a first direction than the first isolation region 130 overlaps of the underlying P-type first deep well 140 in the first direction.

Figure 5:
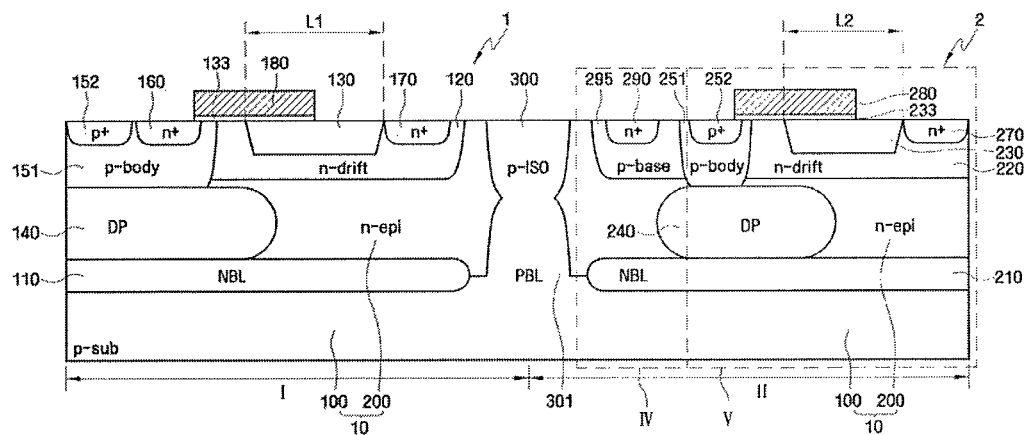

A semiconductor device according to still another exemplary embodiment will now be described with reference to FIG. 5. FIG. 5 illustrates a cross-sectional view of a semiconductor device according to still another exemplary embodiment. An exemplary equivalent circuit of the semiconductor device shown in FIG. 5 may be substantially the same or similar to that of FIG. 1. In FIG. 5, substantially the same functional components as those of FIGS. 1 to 4 are denoted by the same reference numerals and detailed descriptions thereof will be omitted.

Referring to FIG. 5, the semiconductor device according to an exemplary embodiment, may include a predetermined portion of the P-type second deep well 240 overlapping the P-type base region 295, unlike in the semiconductor device shown in FIG. 2. The P-type second deep well 240 may overlap a partial portion of the P-type base region 295. For example, the P-type second deep well 240 may only overlap one side of the P-type second deep well 240 that surrounds a lateral side of the N-type emitter region 290. If the P-type second deep well 240 overlaps all portions of the P-type base region 295, the current capability of a bipolar transistor 3 may be reduced. Accordingly, the P-type second deep well 240 may not overlap all portions of the P-type base region 295.

Figure 6:
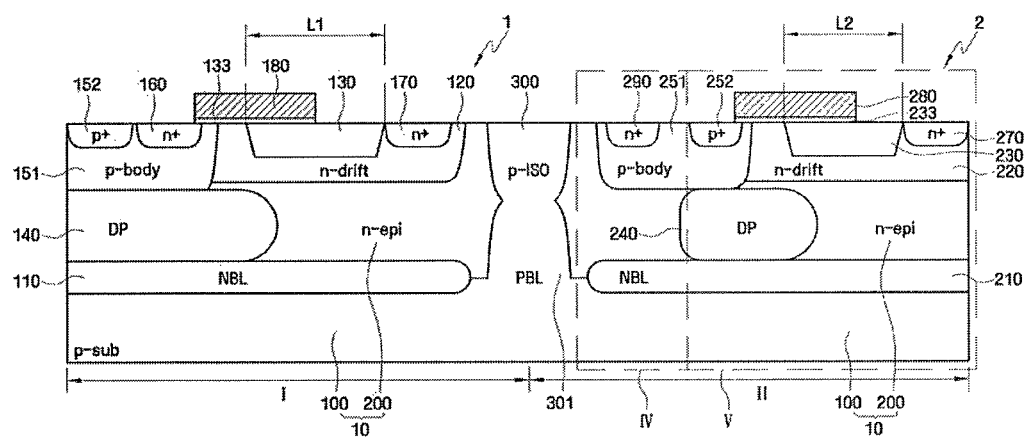

A semiconductor device, according to another exemplary embodiment, will now be described with reference to FIG. 6. FIG. 6 illustrates a cross-sectional view of a semiconductor device according to the exemplary embodiment. An exemplary equivalent circuit of the semiconductor device shown in FIG. 6 may be substantially the same as or similar to that of FIG. 1. In FIG. 6, substantially the same functional components as those of FIGS. 1 to 5 are denoted by the same reference numerals and detailed descriptions thereof will be omitted.

Referring to FIG. 6, the P-type second body region 251 may be formed to surround an N-type emitter region 290, e.g., without forming the P-type base region 295, unlike the semiconductor device shown in FIG. 2. In this regard, the P-type second body region 251 may surround both the N-type emitter region 290 and the P-type second body contact region 252. According to an exemplary embodiment, a doping concentration of the P-type second body region 251 may be higher than the doping concentration of the P-type second deep well 240. The P-type second body region 251 may include a first portion, e.g., under the P-type second body contact region 252, that contacts the P-type second deep well 240 and a second portion, e.g., under the N-type emitter region 290, that is in a non-contacting relationship with the P-type second deep well 240.

Figure 7:
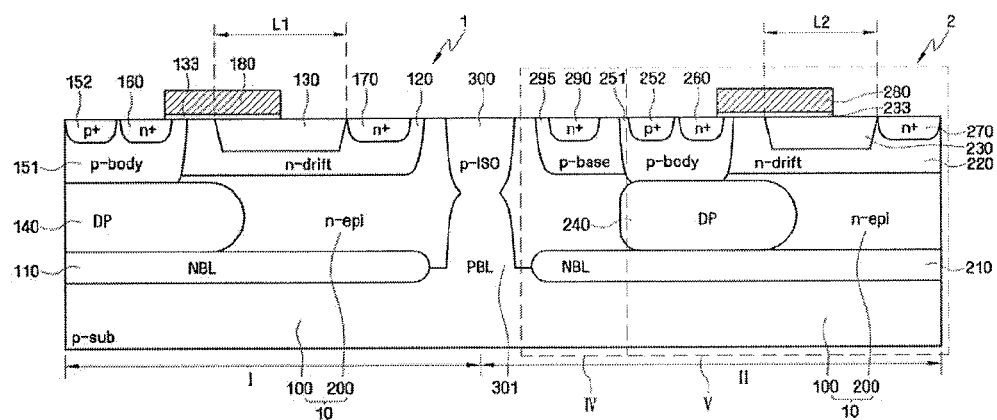

A semiconductor device, according to still another exemplary embodiment will now be described with reference to FIG. 7. FIG. 7 illustrates a cross-sectional view of a semiconductor device according to another the exemplary embodiment. An equivalent circuit of the semiconductor device shown in FIG. 7 may be the same as or substantially similar to that of FIG. 1. In FIG. 7, substantially the same functional components as those of FIGS. 1 to 6 are denoted by the same reference numerals and detailed descriptions thereof will be omitted.

Referring to FIG. 7, in the semiconductor device, a second LDMOS device region V may includes an N-type second source region 260 formed at one side of a second gate 280, unlike in the semiconductor device shown in FIG. 2. Thus, the second LDMOS device 4 in the second LDMOS device region V may be constituted by, e.g., LDMOS transistors. If the ESD protection device 2 includes the bipolar transistor 3, even if the second LDMOS device 4 is constituted by LDMOS transistors, the current may flow to the bipolar transistor 3 in an event of electrostatic discharge.

Figure 8:
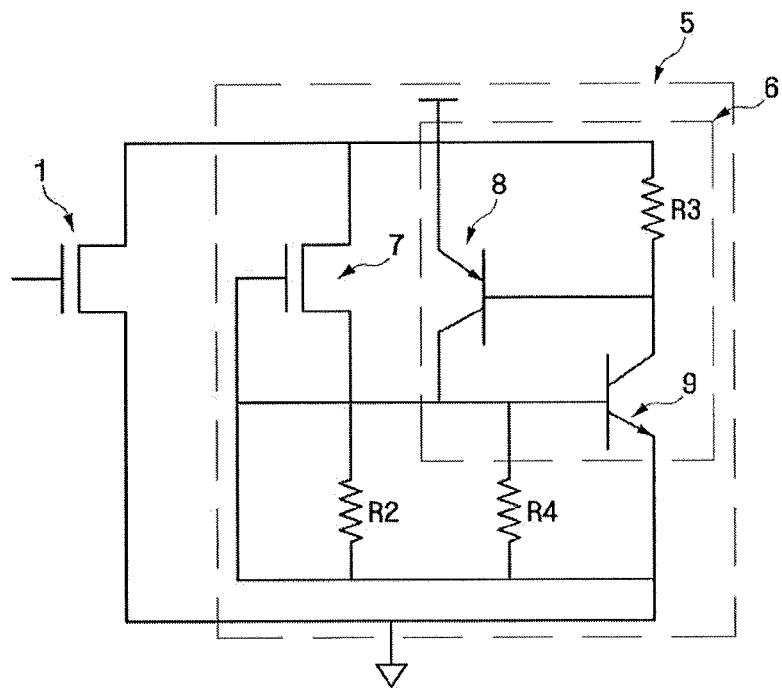
FIG. 8 illustrates an equivalent circuit view of a semiconductor device, according to an exemplary embodiment.

A semiconductor device, according to still another exemplary embodiment, will now be described with reference to FIGS. 8 to 10. In the semiconductor device, according to the exemplary embodiment, an ESD protection device includes, e.g., a silicon controlled rectifier (SCR). FIG. 8 illustrates an equivalent circuit view of a semiconductor device according to an exemplary embodiment, FIG. 9 illustrates a cross-sectional view of the semiconductor device shown in FIG. 8, and FIG. 10 illustrates the equivalent circuit view shown in FIG. 8 incorporated into the cross-sectional view of FIG. 9.

Figure 9:
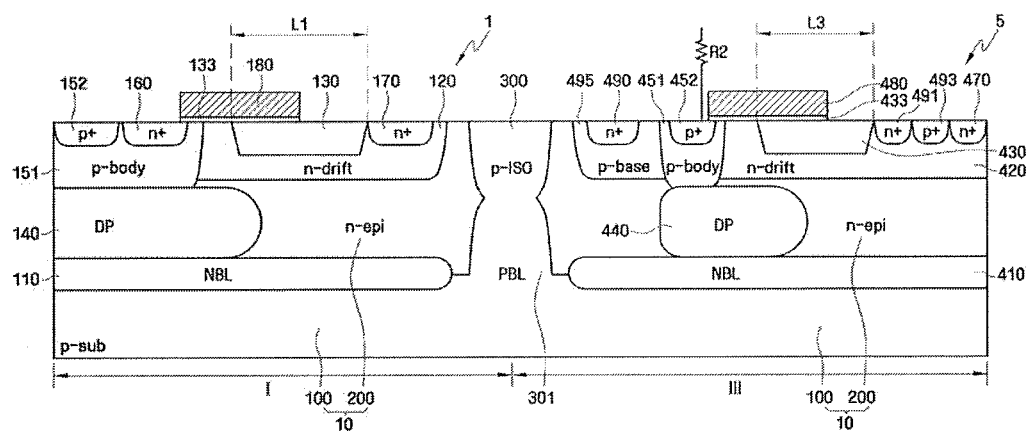
FIG. 9 illustrates a cross-sectional view of the semiconductor device shown in FIG. 8.
Figure 10:
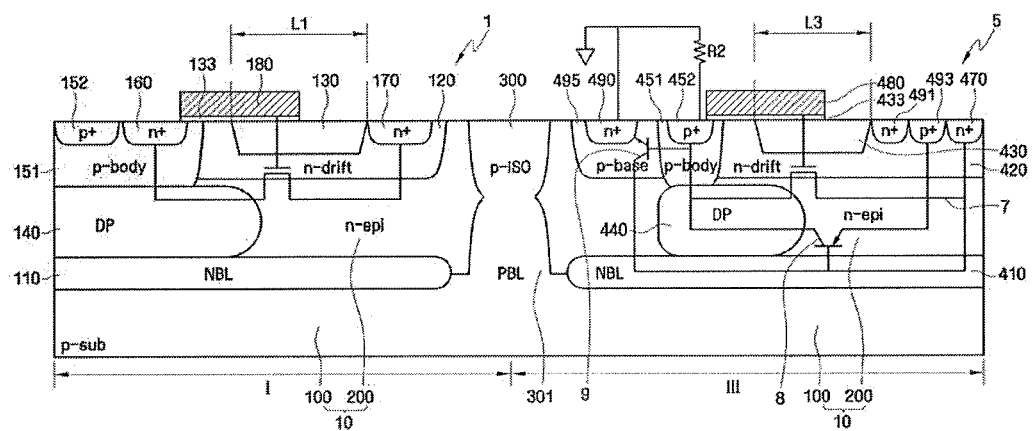
FIG. 10 illustrates the equivalent circuit view shown in FIG. 8 incorporated into the cross-sectional view of FIG. 9.

Referring to FIGS. 8 and 9, the semiconductor device may include a first LDMOS device 1 in an output port and an ESD protection device 5 that, e.g., protects the output port from electrostatic discharge. The ESD protection device 5 may include a silicon controlled rectifier 6 and a third LDMOS device 7. Through the specification, the silicon controlled rectifier 6 means a device including a PNP bipolar transistor 8 and an NPN bipolar transistor 9.

For convenience of explanation, FIGS. 8 and 9 illustrate the first LDMOS device 1 as an N-type LDMOS transistor, and the third LDMOS device 7 as including an N-type drain region. However, embodiments are not limited thereto. For example, it should be appreciated by one skilled in the art that the first LDMOS device 1 may be a P-type LDMOS transistor and the third LDMOS device 7 may include a P-type drain region. As such, N-type and P-type may be reversed, according to an exemplary embodiment.

Referring to FIG. 9, a substrate 10 may include a first region I, e.g., where the first LDMOS device 1 of the output port is formed, and a third region III, e.g., where an ESD protection device 5 is formed. The first LDMOS device 1 formed in the first region I may be substantially the same as or similar to the first LDMOS device 1 shown in FIG. 2. Accordingly, a detailed description thereof will be omitted.

Hereinafter, the ESD protection device 5 formed in the third region III will be described. A third gate 480 may be formed on portions of an N-type third drift region 420 and a third isolation region 430. A third gate insulation layer 433 may be formed under the third gate 480.

A P-type third body region 451 may be formed at one side of the third gate 480. A P-type third body contact region 452 may be formed in the P-type third body region 451, e.g., adjacent to the third gate insulating layer 433. The third gate 480 may overlap the P-type third body contact region 452.

An N-type third drain region 470 may be formed at the other side, e.g., the opposing side, of the third gate 480. A drain voltage may be applied to the N-type third drain region 470. An N-type impurity region 491 and a P-type emitter region 493 may be sequentially formed between the third isolation region 430 and the N-type third drain region 470. The N-type impurity region 491 may reduce the possibility of and/or prevent a punch-through current from flowing, e.g., when a depletion region formed between a P-type third deep well 440 and an N-type epitaxial layer 200 extends to the P-type emitter region 493 due to the drain voltage applied to the N-type third drain region 470.

The N-type third drift region 420 may extend from the P-type third body region 451 in the substrate 10 to the N-type third drain region 470. For example, the N-type third drift region 420 may be formed to surround the third isolation region 430, the N-type impurity region 491, the P-type emitter region 493, and the N-type third drain region 470. The N-type third drift region 420 may be spaced apart from the P-type third deep well 440 and may be formed on the N-type epitaxial layer 200.

The P-type third deep well 440 may be disposed between the N-type third drift region 420 and the N-type third buried layer 410. The P-type third deep well 440 may substantially contact the P-type third body region 451, e.g., substantially an entire bottom surface of the P-type third body region 451 may directly contact the P-type third deep well 440.

An N-type emitter region 490 and a P-type base region 495 may be formed under the N-type emitter region 490. The P-type base region 495 may surround the N-type emitter region 490. The N-type emitter region 490 may be formed between the P-type third body region 451 and the P-type insulation layer 300. As described above in the semiconductor device according to the previous embodiment shown in FIGS. 1 to 3, the P-type base region 495 and the P-type third deep well 440 may be formed so as not to overlap each other, i.e., to be in a non-overlapping relationship. A depth from a top surface of the substrate 10 to a bottom surface of the P-type base region 495 may be smaller than a depth from the top surface of the substrate 10 to a bottom surface of the P-type third body region 451. A height from a bottom surface of the substrate 10 to the bottom surface of the P-type base region 495 may be greater than a height from the bottom surface of the substrate 10 to the bottom surface of the P-type third body region 451. The P-type base region 495 and the P-type third body region 451 may contact each other, e.g., may be in an abutting relationship. The P-type base region 495 may function as a base of a bipolar transistor, and the current capability of the ESD protection device 5 may be increased by lowering the doping concentration of the P-type base region 495 and reducing a junction depth.

Referring to FIGS. 8 and 10, the N-type first source region 160, the N-type first drain region 170, and the first gate 180 area may be a source, a drain, and a gate of the first LDMOS device 1, respectively. The N-type third drain region 470 and the third gate 480 may be a drain and a gate of the third LDMOS device 7, respectively. The P-type emitter region 493, the N-type epitaxial layer 200, and the P-type third body contact region 452 may be an emitter, a base, and a collector of a PNP bipolar transistor 8, respectively. The N-type emitter region 490, the P-type base region 495, and the N-type third drain region 470 may be an emitter, a base, and a collector of an NPN bipolar transistor 9, respectively.

In FIG. 8, R2 may refer to a resistor of, e.g., an external poly resistor connected to the P-type second body region 452. The external poly resistor may be formed of, e.g., polysilicon for forming the third gate 480. The external poly resistor may be a resistor provided as a passive element. R3 may refer to a resistor of, e.g., the N-type third drift region 420. R4 may refer to a resistor of, e.g., the P-type base region 495.

The N-type third drain region 470 of the third LDMOS device 7 and the P-type emitter region 493 of the PNP bipolar transistor 8 may be connected to a power supply voltage through, e.g., an output pad. R2 and of the N-type emitter region 490 of the NPN bipolar transistor 9 may be connected to a ground voltage. The P-type third body contact region 452, the P-type third body region 451, and the P-type base region 495 may be connected to each other.

Referring to FIGS. 8 to 10, the semiconductor device may be designed such that a breakdown voltage of the ESD protection device 5 may be higher than an operating voltage of the semiconductor device and lower than a breakdown voltage of the first LDMOS device 1 in the output port. For example, a breakdown voltage of the third LDMOS device 7 may be made to be equal to or lower than that of the first LDMOS device 1.

According to an exemplary embodiment, the breakdown voltage of the ESD protection device 5 may be generated at the third LDMOS device 7. Since both of the first LDMOS device 1 and the third LDMOS device 7 may be formed of LDMOS devices, the breakdown voltages thereof may be generated in the same mechanism. If the semiconductor device is designed such that the breakdown voltage of the third LDMOS device 7 is made to be lower than that of the first LDMOS device 1, the breakdown voltage of the third LDMOS device 7 may be lower than that of the first LDMOS device 1 all the time. As such, the breakdown voltage of the ESD protection device 5 may be kept lower than that of the first LDMOS device 1 all the time. Accordingly, the possibility of a failure due to electrostatic discharge may be reduced and/or prevented.

According to an exemplary embodiment, if the ESD protection device 5 includes a silicon controlled rectifier 6 including the PNP bipolar transistor 8 and the NPN bipolar transistor 9, even if the breakdown voltage of the third LDMOS device 7 is equal to that of the first LDMOS device 1, the breakdown voltage of the ESD protection device 5 may be all the time lower than the breakdown voltage of the first LDMOS device 1. As such, even if the breakdown voltage of the third LDMOS device 7 is equal to that of the first LDMOS device 1, the possibility of failure due to electrostatic discharge may be reduced and/or prevented.

A length L3 of the third isolation region 430 may be made equal to or smaller than a length L1 of the first isolation region 130 of the first LDMOS device 1, e.g., in order to design the semiconductor device such that the breakdown of the third LDMOS device 7 is made to be equal to or lower than that of the first LDMOS device 1, according to an exemplary embodiment.

Referring to FIGS. 8 to 10, the operation of the semiconductor device in an event of electrostatic discharge will be described. If electrostatic discharge is generated, drain voltages of the first and third LDMOS devices 1 and 7 may increase. According to an exemplary embodiment, if the breakdown voltage of the third LDMOS device 7 is equal to or lower than that of the first LDMOS device 1, breakdown may occur to the third LDMOS device 7 rather than to the first LDMOS device 1.

If the breakdown occurs to the third LDMOS device 7, a current derived from impact ionization may flow in the third LDMOS device 7. Accordingly, the current may flow in a P-type third body contact region 452 of the third LDMOS device 7 and then may flow toward the resistor R2. Therefore, a voltage drop in the resistor R2 may be generated. If the voltage of the resistor R2 is equal to or greater than the turn-on voltage of the NPN bipolar transistor 9, the NPN bipolar transistor 9 may operate.

If the current is continuously increased due to, e.g., impact ionization, a voltage drop may be generated in the resistor R3 due to, e.g., the current flowing in the resistor R3. If the voltage of the resistor R3 is equal to or greater than the turn-on voltage of the PNP bipolar transistor 8, the PNP bipolar transistor 8 may operate. If both of the PNP bipolar transistor 8 and the NPN bipolar transistor 9 are in operational mode, the current may rapidly increase due to, e.g., a positive feedback state. As such, the current, e.g., all the current, generated by electrostatic discharge may flow in the PNP bipolar transistor 8 and the NPN bipolar transistor 9, thereby protecting the first LDMOS device 1 in the output port.

Hereinafter, modifications of a semiconductor device according to another exemplary embodiment will be described with reference to FIGS. 11 to 14. FIGS. 11 to 14 illustrate cross-sectional views of modifications of a semiconductor device, according to exemplary embodiments.

An equivalent circuit of the semiconductor device shown in FIGS. 11 to 14 may be substantially the same as or similar to that of FIG. 8. In FIGS. 11 to 14, substantially the same functional components as those of FIGS. 8 to 10 are denoted by the same reference numerals and detailed descriptions thereof will be omitted.

Figure 11:
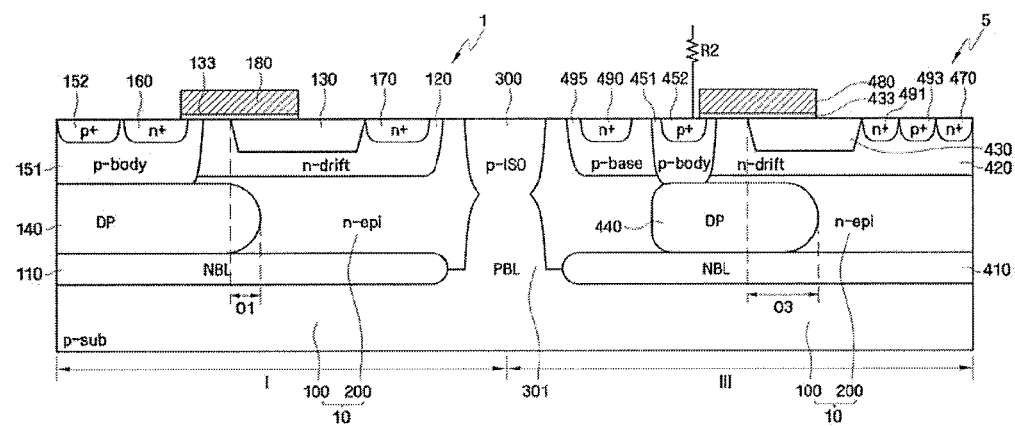
FIGS. 11 to 14 illustrate cross-sectional views of semiconductor devices, according to exemplary embodiments.

Referring to FIG. 11, a semiconductor device includes an alternative exemplary design scheme for making the breakdown voltage of the third LDMOS device 7 equal to or lower than the breakdown voltage of the first LDMOS device 1. An overlapping length O3 between the third isolation region 430 and the P-type third deep well 440 may be made to be equal to or greater than an overlapping length O1 between the first isolation region 130 and the P-type first deep well 140. The first isolation region 130 may have a length equal to or longer than a length of the third isolation region 430. For example, the P-type third deep well 440 may overlap a greater portion, e.g., percentage, of the length of the third isolation region 430 than the P-type first deep well 140. The P-type third deep well 440 may overlap a greater portion, e.g., percentage, of a length of the third gate 480 than the P-type first deep well 140 overlaps of the first gate 180.

Figure 12:
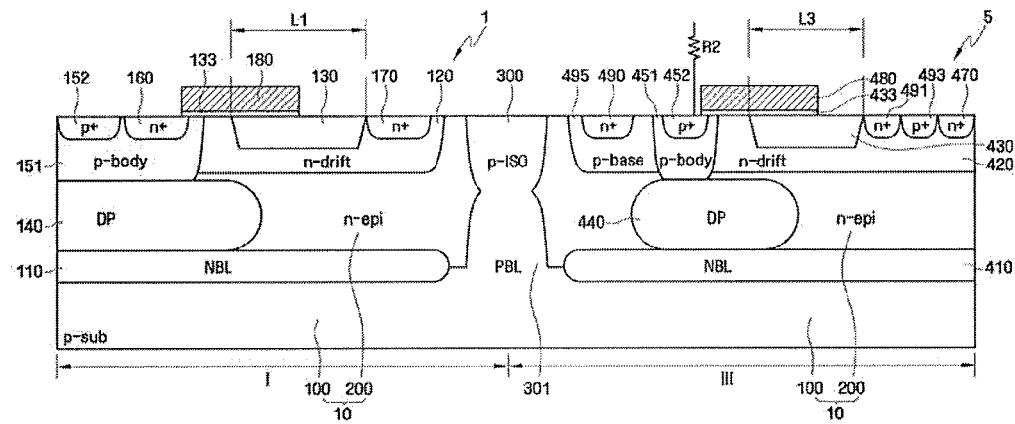

Referring to FIG. 12, a predetermined portion of the P-type third deep well 440 may overlap the P-type base region 495, e.g., may overlap only a portion of the P-type base region 495 surrounding one lateral side of the N-type emitter region 490. If the P-type third deep well 440 were to overlap all portions of the P-type base region 495, the current capability of a silicon controlled rectifier 6 may be reduced. Accordingly, the P-type third deep well 440 may not overlap all portions of the P-type base region 495.

Figure 13:
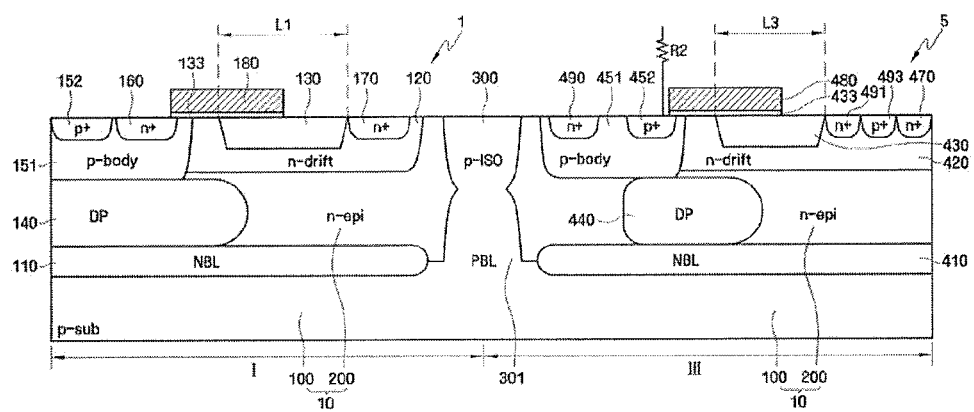

Referring to FIG. 13, in a semiconductor device, the P-type second body region 451 may be formed to surround the N-type emitter region 490 without forming the P-type base region 495, e.g., of FIG. 9. In this regard, the P-type second body region 451 may surround both the N-type emitter region 490 and the P-type second body contact region 452. According to an exemplary embodiment, the doping concentration of the P-type second body region 451 may be higher than the doping concentration of the P-type second deep well 440. The P-type second body region 451 may include a first portion, e.g., under the P-type second body contact region 452, that contacts the P-type second deep well 440 and a second portion, e.g., under the N-type emitter region 490, that is in a non-contacting relationship with the P-type second deep well 440.

Figure 14:
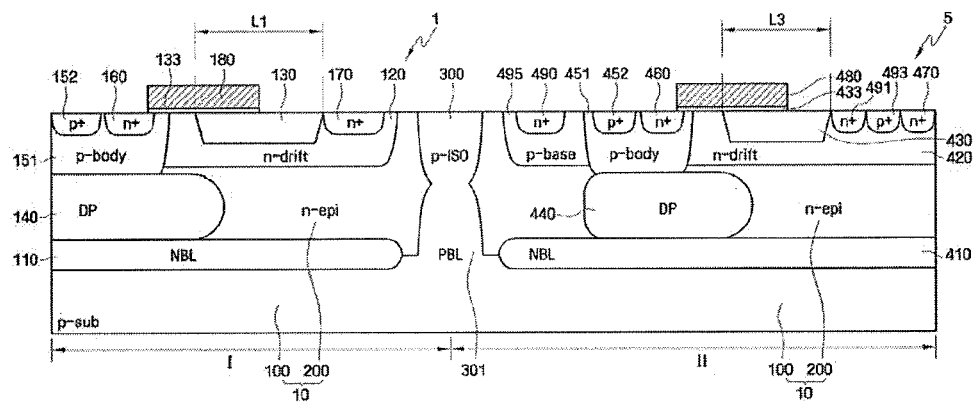

Referring to FIG. 14, the N-type third source region 460 may be formed at one side of a third gate 480 in the P-type third body region 451. Accordingly, the third LDMOS device 7 may be formed of an LDMOS transistor. If an ESD protection device 5 includes a silicon controlled rectifier 6 including bipolar transistors 8 and 9, even if the third LDMOS device 7 is formed of an LDMOS transistor, the current may flow in the silicon controlled rectifier 6 in an event of electrostatic discharge.

A semiconductor device, according to another exemplary embodiment, will now be described with reference to FIGS. 15 to 17.

In the semiconductor device, according to the exemplary embodiment, an ESD protection device may include a silicon controlled rectifier, e.g., like in the semiconductor device shown in FIGS. 8 to 10. FIG. 15 illustrates an equivalent circuit view of a semiconductor device, FIG. 16 illustrates a cross-sectional view of the semiconductor device shown in FIG. 15, and FIG. 17 illustrates the equivalent circuit view shown in FIG. 15 incorporated into the cross-sectional view of FIG. 16. In FIGS. 15 to 17, substantially the same functional components as those of FIGS. 8 to 10 are denoted by the same reference numerals and detailed descriptions thereof will be omitted. As such, the following description will focus on differences.

Figure 15:
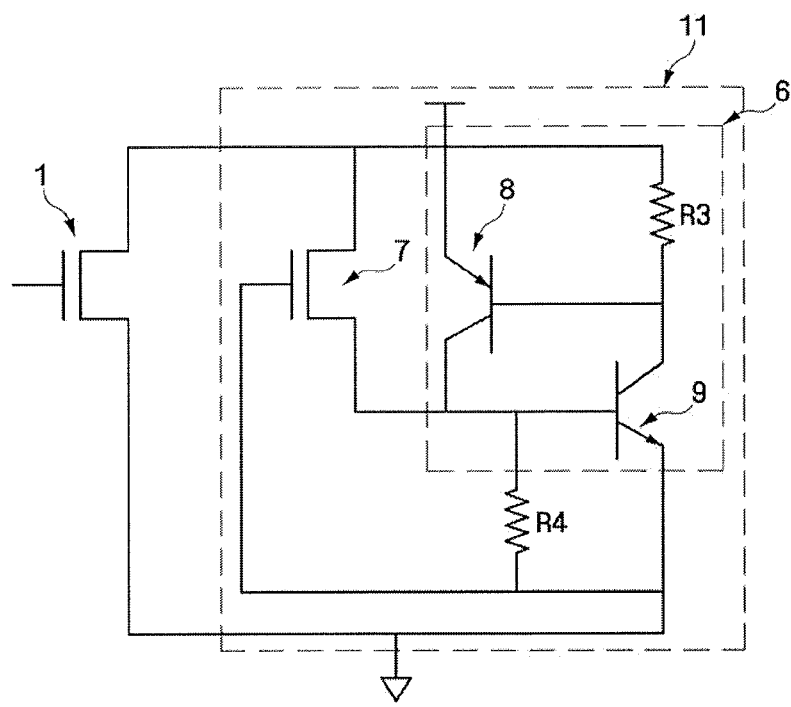
FIG. 15 illustrates an equivalent circuit view of a semiconductor device, according to an exemplary embodiment.
Figure 16:
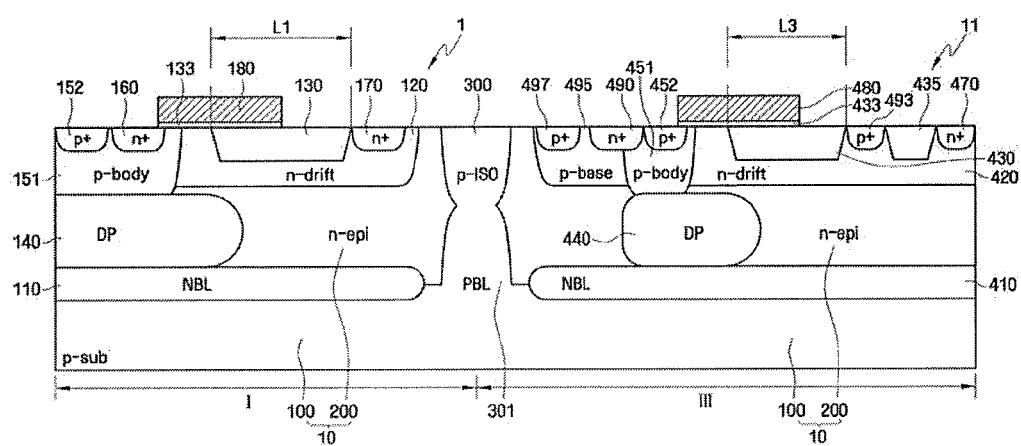
FIG. 16 illustrates a cross-sectional view of the semiconductor device shown in FIG. 15.

Referring to FIGS. 15 and 16, in an ESD protection device 11, the P-type emitter region 493 and a fourth isolation region 435 may be sequentially formed between the third isolation region 430 and an N-type third drain region 470. The N-type emitter region 490 may be formed in both the P-type third body region 451 and the P-type base region 495, e.g., the N-type emitter region 490 may extend over both the P-type third body region 451 and the P-type base region 495.

A P-type base contact region 497 may be formed at one side of the N-type emitter region 490. The P-type base contact region 497 may be formed in the P-type base region 495, e.g., the P-type base contact region 497 may be spaced apart from the N-type emitter region 490 by a portion of the P-type base region 495. According to an exemplary embodiment, the external poly resistor connected to a P-type third body contact region 452 may not be formed, i.e., may be excluded.

Figure 17:
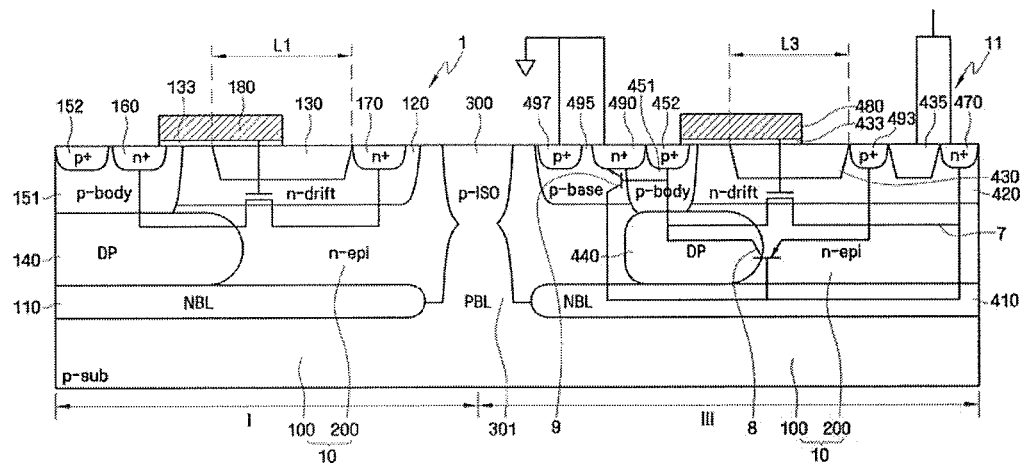
FIG. 17 illustrates the equivalent circuit view shown in FIG. 15 incorporated into the cross-sectional view of FIG. 16.

Referring to FIGS. 15 and 17, the N-type first source region 160, the N-type first drain region 170, and the first gate 180 may be a source, a drain and a gate of the first LDMOS device 1, respectively. The N-type third drain region 470 and the third gate 480 may be a drain and a gate of a third LDMOS device 7, respectively. The P-type emitter region 493, an N-type epitaxial layer 200, and the P-type third body contact region 452 may be an emitter, a base, and a collector of a PNP bipolar transistor 8, respectively. The N-type emitter region 490, the P-type base region 495, and the N-type third drain region 470 may be an emitter, a base, and a collector of an NPN bipolar transistor 9, respectively.

In FIG. 15, R3 may refer to a resistor of the N-type third drift region 420. R4 may refer to a resistor of the P-type base region 495. The N-type third drain region 470 of the third LDMOS device 7 and the P-type emitter region 493 of the PNP bipolar transistor 8 may be connected to, e.g., a power supply voltage through an output pad. The N-type emitter region 490 of an NPN bipolar transistor 9 and P-type base contact region 497 may be connected to a ground voltage. The P-type third body contact region 452, the P-type third body region 451, and the P-type base region 495 may be connected to each other, according to an exemplary embodiment.

Referring to FIGS. 15 to 17, the semiconductor device may be designed so that a breakdown voltage of an ESD protection device 11 may be higher than an operating voltage of the semiconductor device and may be lower than a breakdown voltage of the first LDMOS device 1 in the output port. For example, the semiconductor device may be designed so that a breakdown voltage of the third LDMOS device 7 may be equal to or lower than the breakdown voltage of the first LDMOS device 1.

In order to make the breakdown of the third LDMOS device 7 equal to or lower than that of the first LDMOS device 1, in another exemplary embodiment, a length L3 of the third isolation region 430 may be made to be equal to or smaller than a length L1 of the first isolation region 130 of the first LDMOS device 1.

Referring to FIGS. 15 to 17, the operation of the semiconductor device in an event of electrostatic discharge will be described. According to an exemplary embodiment, if electrostatic discharge is generated, drain voltages of the first and third LDMOS devices 1 and 7 may increase. If the breakdown voltage of the third LDMOS device 7 is equal to or lower than that of the first LDMOS device 1, breakdown may occur to the third LDMOS device 7 rather than to the first LDMOS device 1.

If the breakdown occurs to the third LDMOS device 7, a current derived from, e.g., impact ionization, may flow in the third LDMOS device 7. The current may flow in the P-type third body contact region 452 of the third LDMOS device 7 and then may flow toward the resistor R4. As such, a voltage drop may be generated in the resistor R4. If the voltage of the resistor R4 is equal to or greater than the turn-on voltage of the NPN bipolar transistor 9, the NPN bipolar transistor 9 may operate.

If the current is continuously increased due to, e.g., impact ionization, a voltage drop may be generated in the resistor R3 due to, e.g., the current flowing in the resistor R3. If the voltage of the resistor R3 is equal to or greater than the turn-on voltage of the PNP bipolar transistor 8, the PNP bipolar transistor 8 may operates. If both of the PNP bipolar transistor 8 and the NPN bipolar transistor 9 are in operational mode, the current rapidly may increases due to, e.g., a positive feedback state. Accordingly, current, e.g., all of the current, generated by electrostatic discharge may flow in the PNP bipolar transistor 8 and the NPN bipolar transistor 9. Thereby, the first LDMOS device 1 in the output port may be protected.

Exemplary modifications of the semiconductor device shown in FIG. 16 will be described with reference to FIGS. 18 to 21. FIGS. 18 to 21 illustrate cross-sectional views of modifications of the semiconductor device shown in FIG. 16. An equivalent circuit of the semiconductor device shown in FIGS. 18 to 21 may be substantially the same as or similar to that of FIG. 15. In FIGS. 18 to 21, substantially the same functional components as those of FIGS. 15 to 17 are denoted by the same reference numerals and detailed descriptions thereof will be omitted.

Figure 18:
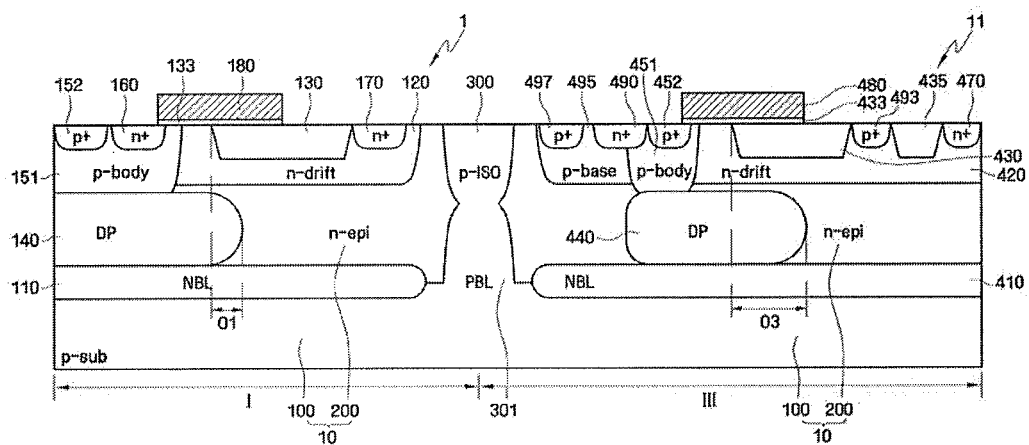
FIGS. 18 to 21 illustrate cross-sectional views of exemplary modifications of the semiconductor device shown in FIG. 16.

Referring to FIG. 18, a semiconductor device includes an exemplary alternative design scheme for making a breakdown voltage of a third LDMOS device 7 equal to or lower than that of a first LDMOS device 1. For example, an overlapping length O3 between a third isolation region 430 and a P-type second deep well 440 may be made to be equal to or greater than an overlapping length O1 between the first isolation region 130 and the P-type first deep well 140.

Figure 19:
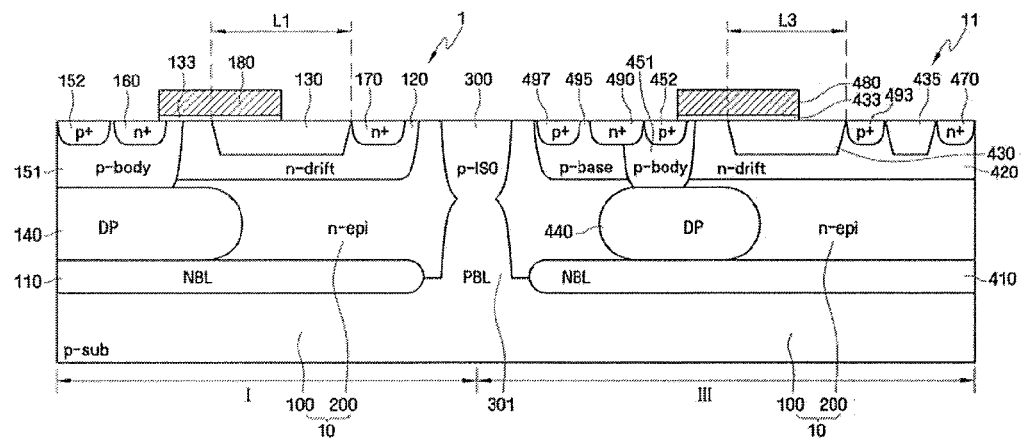

Referring to FIG. 19, a predetermined portion of the P-type third deep well 440 may overlap the P-type base region 495. If the P-type third deep well 440 overlaps all portions of the P-type base region 495, the current capability of a silicon controlled rectifier 6 may be reduced. Accordingly, the P-type third deep well 440 may not overlap all portions of the P-type base region 495.

Figure 20:
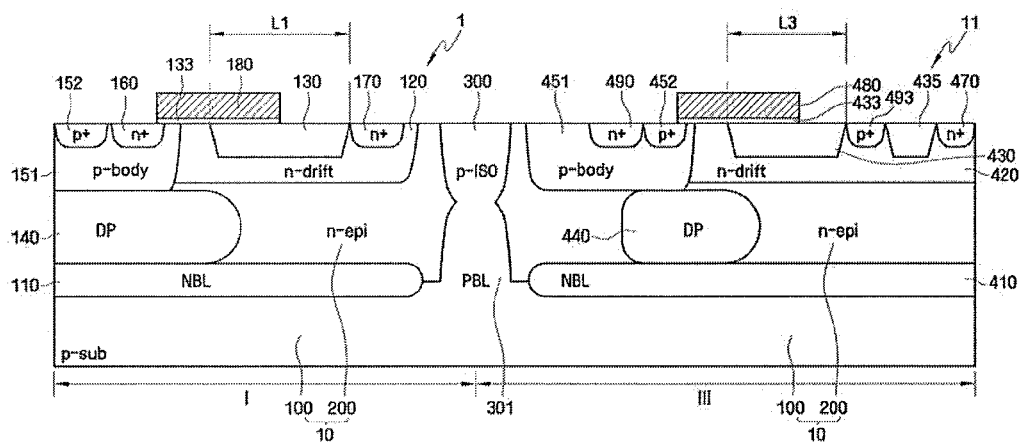

Referring to FIG. 20 the P-type third body region 451 may be formed to surround an N-type emitter region 490 without forming the P-type base region 495, e.g., of FIG. 16. According to an exemplary embodiment, the P-type base contact region 497, e.g., of FIG. 16, may not be formed, i.e., may be excluded in the semiconductor device.

Figure 21:
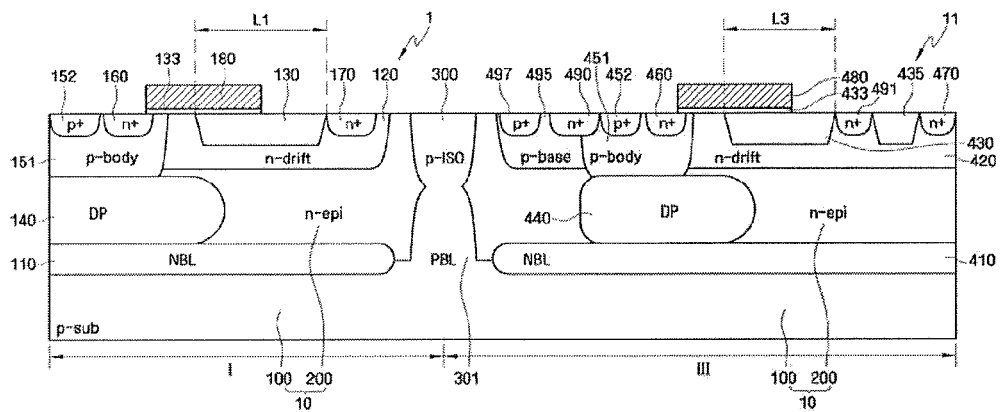

Referring to FIG. 21, the N-type third source region 460 may be formed at one side of the third gate 480 in the P-type third body region 451. Accordingly, a third LDMOS device 7 may be formed of an LDMOS transistor. If the ESD protection device 11 includes the silicon controlled rectifier 6 including bipolar transistors 8 and 9, even if the third LDMOS device 7 is formed of an LDMOS transistor, the current may flow in the silicon controlled rectifier 6 in an event of electrostatic discharge.

An exemplary method of fabricating a semiconductor device will now be described with reference to FIGS. 2 and 22 to 29. FIGS. 22 to 29 illustrate cross-sectional views depicting structures in intermediate process stages in a fabricating method of a semiconductor device, according to an exemplary embodiment.

Figure 22:
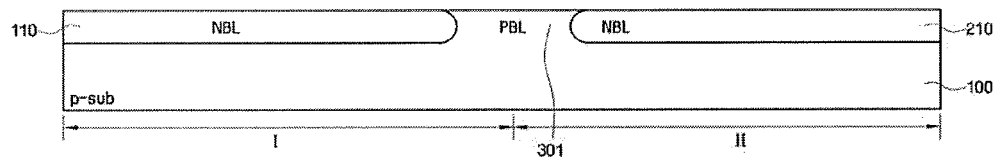
FIGS. 22 to 29 illustrate cross-sectional views of exemplary stages in a method of fabricating a semiconductor device, according to an exemplary embodiment.

Referring to FIG. 22, the N-type first buried layer 110 and an N-type second buried layer 210 are formed in a P-type bulk substrate 100. For example, mask patterns (not shown) having regions defined therein may be formed on the P-type bulk substrate 100. The regions in the mask patterns may be potential regions for forming the N-type first buried layer 110 and the N-type second buried layer 210. Then, N-type impurity may be implanted onto the P-type bulk substrate 100 through the mask patterns. Thereafter, the mask patterns may be removed, and the N-type first buried layer 110 and the N-type second buried layer 210 may be formed in the P-type bulk substrate 100.

Next, a P-type buried layer 301 may be formed between the N-type first buried layer 110 and the N-type second buried layer 210 in the P-type bulk substrate 100. For example, a mask pattern (not shown) having a region defined therein may be formed on the P-type bulk substrate 100, and the region may be a potential region for forming the P-type buried layer 301. Then, P-type impurity may be implanted onto the P-type bulk substrate 100, the mask pattern may be removed, and the P-type buried layer 301 may be formed.

Figure 23:
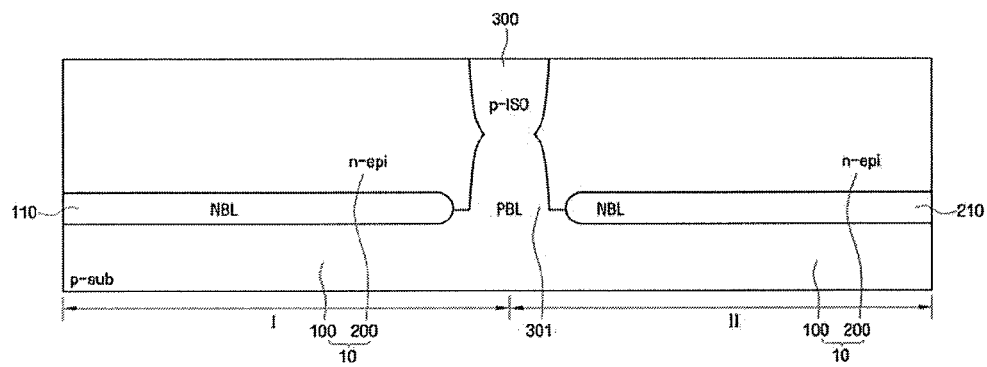

Referring to FIG. 23, an N-type epitaxial layer 200 may be formed on the P-type bulk substrate 100. For example, the N-type epitaxial layer 200 may be formed by, e.g., selective epitaxial growth (SEG) or solid phase epitaxial (SPE).

Next, the P-type insulation layer 300 may be formed at a boundary area of the first region I and the second region II. The P-type insulation layer 300 may be formed through, e.g., ion implantation and diffusion of P-type impurity. In order to reduce the number of masks, the P-type insulation layer 300 may be formed when forming P-type deep wells 140 and 240, e.g., of FIG. 24, or the P-type base region 295, e.g., of FIG. 27.

Figure 24:
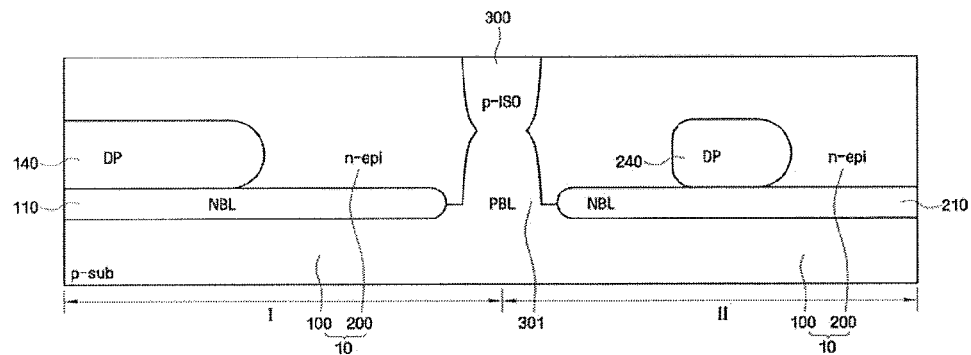

Referring to FIG. 24, the P-type first deep well 140 and P-type second deep well 240 may be formed in the N-type epitaxial layer 200. For example, mask patterns (not shown) having regions defined therein may be formed on the N-type epitaxial layer 200, the regions being potential regions for forming the P-type first deep well 140 and the P-type second deep well 240. Then, P-type impurity may be implanted onto top portions of the N-type first buried layer 110 and the N-type second buried layer 210 in the substrate 10, the mask patterns may be removed, and the P-type first deep well 140 and the P-type second deep well 240 may be formed. A doping concentration of the P-type impurity for forming the P-type first deep well 140 and the P-type second deep well 240 may be in a range of about $1\times10^{15}$ to about $5\times10^{16}$ atoms/cm$^3$. The range for the P-type impurity concentration may be within a narrower range that includes, but is not limited to, e.g., about $2\times10^{15}$ to about $4\times10^{16}$ atoms/cm$^3$, about $3\times10^{15}$ to about $3\times10^{16}$ atoms/cm$^3$, about $9\times10^{15}$ to about $1\times10^{16}$ atoms/cm$^3$, etc.

Figure 25:
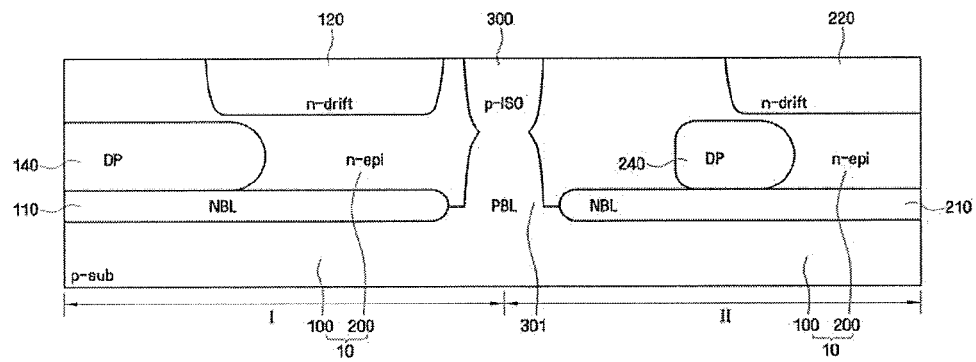

Referring to FIG. 25, the N-type first drift region 120 and the N-type second drift region 220 may be formed on the N-type epitaxial layer 200. For example, mask patterns (not shown) having regions defined therein may be formed on the N-type epitaxial layer 200, and the regions may be potential regions for forming the N-type first drift region 120 and the N-type second drift region 220. Then, N-type impurity may be implanted onto the N-type epitaxial layer 200, the mask patterns may be removed, and the N-type first drift region 120 and the N-type second drift region 220 may be formed. A doping concentration of the N-type impurity for forming the N-type first drift region 120 and the N-type second drift region 220 may be in a range of about $5\times10^{15}$ to about $7\times10^{16}$ atoms/cm$^3$. The range for the N-type impurity concentration may be within a narrower range that includes, but is not limited to, e.g., about $7\times10^{15}$ to about $6\times10^{16}$ atoms/cm$^3$, about $9\times10^{15}$ to about $5\times10^{16}$ atoms/cm$^3$, about $2\times10^{16}$ to about $7\times10^{16}$ atoms/cm$^3$, etc.

Figure 26:
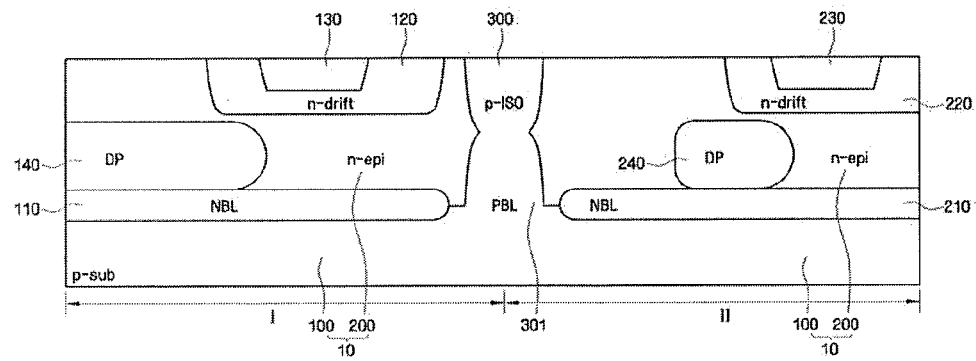

Referring to FIG. 26, the first isolation region 130 and the second isolation region 230 may be formed on the N-type first drift region 120 and the N-type second drift region 220, respectively. The first and second isolation regions 130 and 230 may be formed using, e.g., a shallow trench isolation (STI) process. However, embodiments are not limited thereto. For example, the first and second isolation regions 130 and 230 may be formed using, e.g., a local oxidation of silicon (LOCOS) process. In order to fabricate the semiconductor device shown in FIG. 2, the length of the first isolation region 130 may be made equal to or greater than the length of the second isolation region 230.

Figure 27:
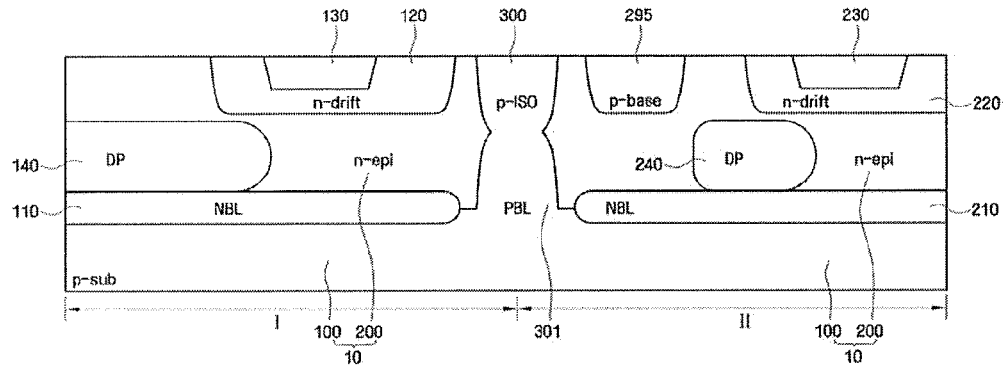

Referring to FIG. 27, the P-type base region 295 may be formed between the P-type insulation layer 300 and the N-type second drift region 220 in the second region II. For example, a mask pattern (not shown) having a region defined therein may be formed on the N-type epitaxial layer 200, and the region may be a potential region for forming the P-type base region 295. Then, P-type impurity may be implanted into the substrate 10, the mask pattern may be removed, and the P-type base region 295 may be formed. In an exemplar embodiment in which the semiconductor device is formed on the substrate 10 having a CMOS device thereon, the P-type base region 295 may be formed at the same time when a P-type well of the CMOS device is formed. A doping concentration of the N-type impurity for forming the P-type base region 295 may be in a range of about $1\times10^{16}$ to about $5\times10^{17}$ atoms/cm$^3$. The range for the N-type impurity concentration may be within a narrower range that includes, but is not limited to, e.g., about $2\times10^{16}$ to about $4\times10^{17}$ atoms/cm$^3$, about $5\times10^{16}$ to about $1\times10^{17}$ atoms/cm$^3$, about $9\times10^{16}$ to about $3\times10^{17}$ atoms/cm$^3$, etc.

Figure 28:
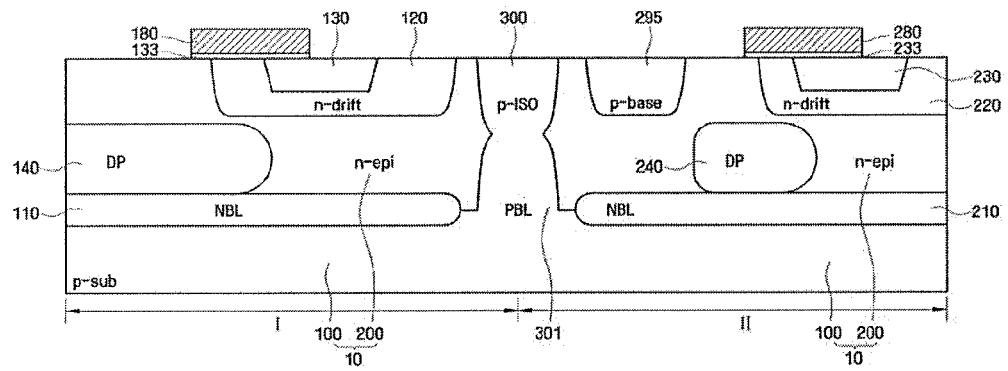

Referring to FIG. 28, the first gate insulation layer 133 and the first gate 180 may be formed on the N-type first drift region 120 and the first isolation region 130. The second gate insulation layer 233 and the second gate 280 may be formed on the N-type second drift region 220 and the second isolation region 230. For example, a pre-gate insulation layer made of, e.g., silicon oxide, and a pre-gate made of, e.g., polysilicon, may be sequentially stacked on the substrate 10. Next, the pre-gate insulation layer and the pre-gate may be patterned to form the first gate insulation layer 133 and the first gate 180, and the second gate insulation layer 233 and the second gate 280, respectively.

Figure 29:
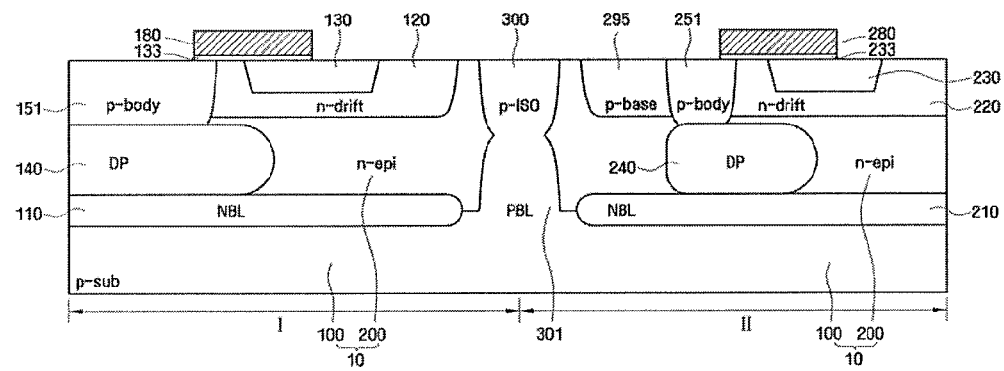

Referring to FIG. 29, the P-type first body region 151 may be formed at one side of the first gate 180, and the P-type second body region 251 may be formed at one side of the second gate 280. For example, mask patterns (not shown) having regions defined therein may be formed, and the regions may be potential regions for forming the P-type first body region 151 and the P-type second body region 251. Then, P-type impurity may be implanted into the substrate 10, the mask patterns may be removed, and the P-type first body region 151 and the P-type second body region 251 may be formed. A doping concentration of the P-type impurity for forming the P-type first body region 151 and the P-type second body region 251 may be in a range of about $5\times10^{16}$ to $8\times10^{17}$ atoms/cm$^3$. The range for the N-type impurity concentration may be within a narrower range that includes, but is not limited to, e.g., about $6\times10^{16}$ to about $7\times10^{17}$ atoms/cm$^3$, about $9\times10^{16}$ to about $4\times10^{17}$ atoms/cm$^3$, about $1\times10^{17}$ to about $3\times10^{17}$ atoms/cm$^3$, etc.

Referring again to FIG. 2, P-type impurity may be implanted into the substrate 10 to form the P-type first body contact region 125 in the P-type first body region 151 and to form the P-type second body contact region 252 in the P-type second body region 251. Then, N-type impurity may be implanted to form the N-type first source region 160, the N-type first drain region 170, the N-type emitter region 290, and the N-type second drain region 270.

Methods of fabricating a semiconductor device according to other exemplary embodiments may be inferred by one skilled in the art from the exemplary method depicted in FIGS. 22 to 29. For example, the following description will focus on differences between the fabrication methods of other exemplary embodiments.

In the fabricating method of the semiconductor device shown in FIG. 4, the overlapping length O2 between the second isolation region 230 and the P-type second deep well 240 may be equal to or greater than the overlapping length O1 between the first isolation region 130 and the P-type first deep well 140.

In the fabricating method of the semiconductor device shown in FIG. 5, a predetermined portion of the P-type second deep well 240 may overlap with the P-type base region 295.

In the fabricating method of the semiconductor device shown in FIG. 6, the stage of forming the P-type base region 295 shown in FIG. 27 may be omitted, and the P-type second body region 251 may be formed to surround the N-type emitter region 290.

In the fabricating method of the semiconductor device shown in FIG. 7, N-type impurity may be implanted into the substrate 10 to from the N-type second source region 260, e.g., during a stage of forming the N-type first source region 160, the N-type first drain region 170, the N-type emitter region 290, and the N-type second drain region 270.

In the fabricating method of the semiconductor device shown in FIG. 9, P-type impurity may be implanted into the substrate 10 to form the P-type emitter region 493, e.g., during a stage of forming the P-type first body contact region 152 and the P-type third body contact region 452. Further, N-type impurity may be implanted into the substrate 10 to form the N-type impurity region 491, e.g., during a stage of forming the N-type first source region 160, the N-type first drain region 170, the N-type emitter region 490, and the N-type third drain region 470.

Methods of fabricating a semiconductor device according to other exemplary embodiments may be inferred by one skilled in the art from the exemplary method depicted in FIGS. 22 to 29 and in view of the about description with respect to FIGS. 4 to 7. For example, a method of fabricating the semiconductor device according to the exemplary embodiments shown in FIGS. 11 to 14 may be inferred.

In an exemplary method of fabricating the semiconductor device shown in FIG. 16, the fourth isolation region 435 may be formed when the first isolation region 130 and the third isolation region 430 are formed. Further, P-type impurity may be implanted into the substrate 10 to form the P-type emitter region 493 and the P-type base contact region 497, during, a stage of forming the P-type first body contact region 152 and the P-type third body contact region 452.

A fabricating method of the semiconductor device according to the embodiment shown may be inferred from, e.g., the exemplary method depicted in FIGS. 22 to 29 and in view of the about description with respect to FIGS. 18 to 21.

In the exemplary fabricating method of the semiconductor device, if LDMOS devices are provided in an output port and an ESD protection device, the LDMOS devices may be fabricated using the same mask. The breakdown voltage of the LDMOS device in the ESD protection device may be made equal to or lower than the breakdown voltage of the LDMOS device in the output port. As such, the breakdown voltage of the LDMOS device in the ESD protection device may be kept equal to or lower than the breakdown voltage of the LDMOS device in the output port, e.g., all the time even if a process dispersion is created. Accordingly, a breakdown voltage of the ESD protection device may be lower than that of the output port all the time, according to an exemplary embodiment.

By way of summation and review, semiconductor integrated circuit (IC) devices manufactured by CMOS technology may be sensitively affected by a high voltage and/or a high current induced by electrostatic discharge generated due to, e.g., contact with a charge carrying object, such as a human body. For example, when the high voltage or high current is induced into an IC chip, the IC may not properly operate because, e.g., an insulating layer may be damaged or broken and/or a channel may be shorted by the transient power of electrostatic discharge.

In contrast, embodiments relate to a semiconductor IC device including an electrostatic discharge protection circuit provided in input/output circuits to, e.g., perform a discharge operation in advance to reduce the possibility of and/or prevent a high voltage or a high current from being induced to an internal device of the semiconductor IC device. Further, embodiments relate to a semiconductor device and a fabricating method thereof that include the electrostatic discharge protection device having a breakdown voltage lower than a breakdown voltage of an output port even if a process dispersion is created.

Embodiments described herein refer to plan views and/or cross-sectional views by way of ideal schematic views of the exemplary embodiments. Accordingly, the exemplary views may be modified depending on manufacturing technologies and/or tolerances. Therefore, embodiments are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the embodiments.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    an output port including a first lateral double diffused metal oxide semiconductor (LDMOS) device; and
    an electrostatic discharge protection device that includes a second LDMOS device and a bipolar transistor and that protects the output port from electrostatic discharge, a breakdown voltage of the second LDMOS device being equal to or lower than a breakdown voltage of the first LDMOS device.

2. The semiconductor device as claimed in claim 1, wherein the first LDMOS device includes:
   a first gate on a substrate,
   a first source region at one side of the first gate, the first source region having a first conductivity type,
   a first body region under the first source region and surrounding the first source region, the first body region having a second conductivity type, the second conductivity type being different from the first conductivity type,
   a first body contact region in the first body region, the first body contact region having the second conductivity type,
   a first drain region at another side of the first gate, the first drain region having the first conductivity type,
   a first isolation region in the substrate between the first source region and the first drain region, the first isolation region overlapping a portion of the first gate,
   a first deep well under the first body region, the first deep well having the second conductivity type, and
   a first buried layer under the first deep well, the first buried layer having the first conductivity type.

3. The semiconductor device as claimed in claim 2, wherein the second LDMOS device includes:
   a second gate on the substrate,
   a second body region at one side of the second gate, the second body region having the second conductivity type,
   a second body contact region in the second body region, the second body contact region having the second conductivity type,
   a second drain region at another side of the second gate, the second drain region having the first conductivity type,
   a second isolation region in the substrate between the second body region and the second drain region, the second isolation region overlapping a portion of the second gate,
   a second deep well under the second body region, the second deep well having the second conductivity type, and
   a second buried layer under the second deep well, the second buried layer having the first conductivity type.

4. The semiconductor device as claimed in claim 3, wherein the second LDMOS device includes a second source region in the second body region, the second source region having the first conductivity type.

5. The semiconductor device as claimed in claim 3, wherein the bipolar transistor includes:
   an emitter region spaced apart from the second body region, the emitter region having the first conductivity type,
   a base region under the emitter region and surrounding the emitter region, the base region having the second conductivity type, and
   the second drain region.

6. The semiconductor device as claimed in claim 5, wherein the bipolar transistor includes an epitaxial layer under the base region.

7. The semiconductor device as claimed in claim 5, wherein the base region is in a non-overlapping relationship with the second deep well.

8. The semiconductor device as claimed in claim 5, wherein a doping concentration of the base region is higher than a doping concentration of the second deep well and lower than a doping concentration of the second body region.

9. The semiconductor device as claimed in claim 5, wherein a first distance from a bottom surface of the substrate to a bottom surface of the base region is greater than a second distance from the bottom surface of the substrate to a bottom surface of the second body region.

10. The semiconductor device as claimed in claim 5, wherein:
    the first LDMOS device includes a first drift region that is under the first isolation region and the first drain region and that surrounds the first isolation region and the first drain region, the first drift region having the first conductivity type, and
    the second LDMOS device includes a second drift region that is under the second isolation region and the second drain region and that surrounds the second isolation region and the second drain region, the second drift region having the first conductivity type.

11. The semiconductor device as claimed in claim 5, wherein a length of the second isolation region is equal to or smaller than a length of the first isolation region.

12. The semiconductor device as claimed in claim 5, wherein a second overlapping length between the second isolation region and the second deep well is equal to or greater than a first overlapping length between the first isolation region and the first deep well.

13. The semiconductor device as claimed in claim 5, wherein a portion of the base region and a portion of the second deep well overlap each other.

14. The semiconductor device as claimed in claim 13, wherein substantially an entire area of the base region is in a non-overlapping relationship with the second deep well.

15. The semiconductor device as claimed in claim 3, wherein the bipolar transistor includes:
    an emitter region in the second body region, the emitter region having the first conductivity type,
    the second body region surrounding the emitter region, and
    the second drain region.

* * * * *